United States Patent
Kaya et al.

(10) Patent No.: US 7,795,970 B2
(45) Date of Patent: Sep. 14, 2010

(54) REDUCTION OF DEAD-TIME DISTORTION IN CLASS D AMPLIFIERS

(75) Inventors: Cetin Kaya, Plano, TX (US); Adam Shook, Dallas, TX (US)

(73) Assignee: Texas Instruments Incorporated, Dallas, TX (US)

( * ) Notice: Subject to any disclaimer, the term of this patent is extended or adjusted under 35 U.S.C. 154(b) by 5 days.

(21) Appl. No.: 12/369,489

(22) Filed: Feb. 11, 2009

(65) Prior Publication Data
US 2010/0201443 A1 Aug. 12, 2010

(51) Int. Cl.
H03F 3/217 (2006.01)
(52) U.S. Cl. .................................. 330/251; 330/207 A
(58) Field of Classification Search ............. 330/207 A, 330/251, 10
See application file for complete search history.

(56) References Cited

U.S. PATENT DOCUMENTS 7,265,617 B2 * 9/2007 Ohkuri ........................ 330/251

2009/0184765 A1 * 7/2009 Chaoui ........................ 330/251

* cited by examiner

Primary Examiner—Khanh V Nguyen
(74) Attorney, Agent, or Firm—John J. Patti; Wade J. Brady, III; Frederick J. Telecky, Jr.

(57) ABSTRACT

Pulse-width-modulating class D amplifier with an H-bridge output stage, and method of operating the same. in which output stage dead-time is compensated. Offset logic circuitry detects various dead-time-related conditions at push-pull output drivers, and generates an offset signal applied to the amplified differential input signal, to adjust the time at which the voltage at differential signal lines crosses a ramp reference waveform. The offset signal can correspond to the duration of a disturbance (dead-time at one driver in combination with an active signal at the active driver), or the sum of that disturbance duration with a dead-time at the active driver. The offset signal is generated by charging a capacitor for the duration of this disturbance, or disturbance plus dead-time. According to another approach, error is reduced by charging a capacitor for each transition of the signal for a duration of the dead-time of the active driver. Total harmonic distortion is reduced without requiring increased circuit complexity and without shortening the dead-time to unsafe margins.

14 Claims, 13 Drawing Sheets

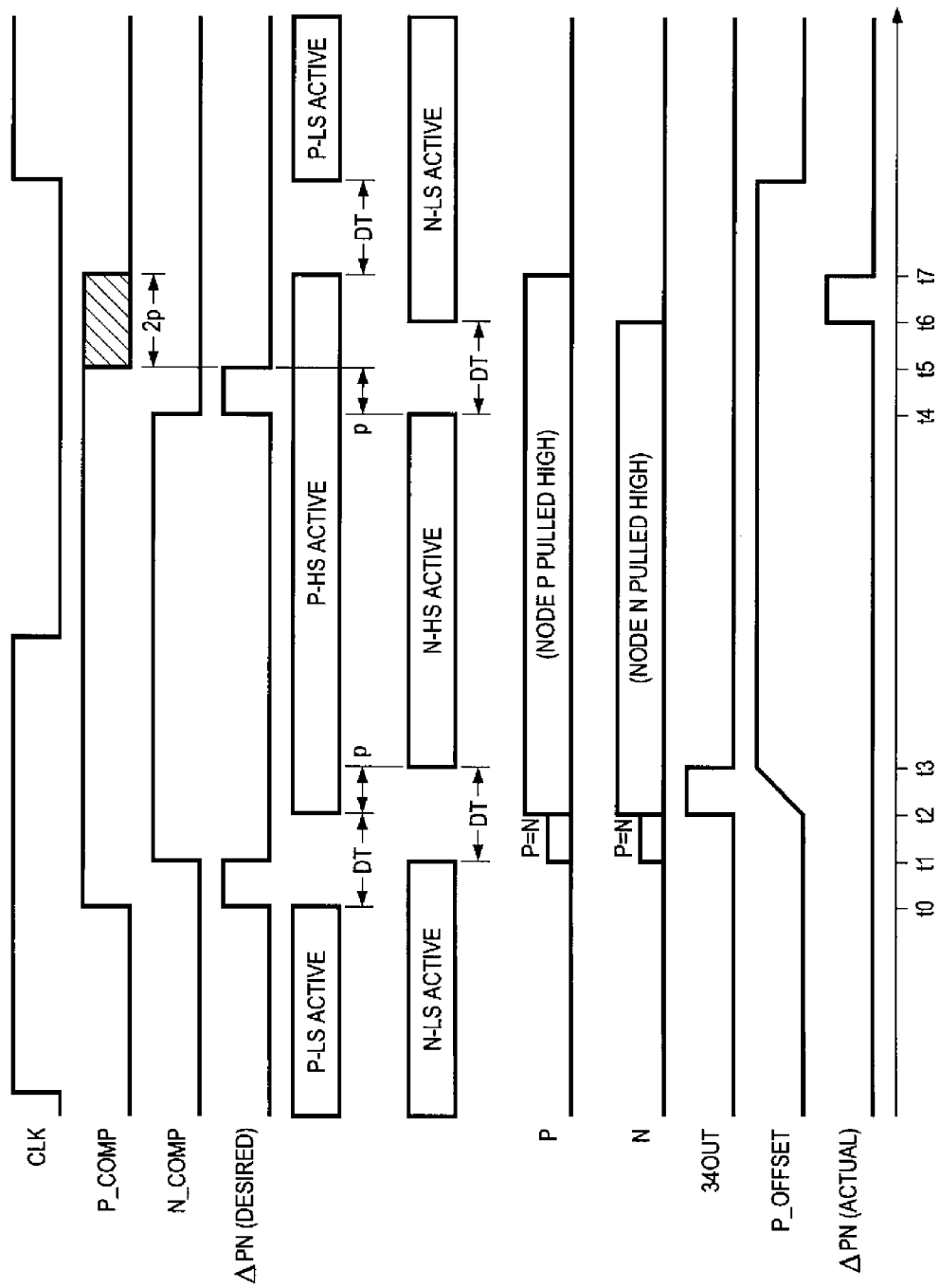

REDUCTION OF DEAD-TIME DISTORTION IN CLASS D AMPLIFIERS

CROSS-REFERENCE TO RELATED APPLICATIONS

Not applicable.

STATEMENT REGARDING FEDERALLY SPONSORED RESEARCH OR DEVELOPMENT

Not applicable.

BACKGROUND OF THE INVENTION

This invention is in the field of audio amplifiers, and is more specifically directed to reduction of harmonic distortion in class D audio amplifiers.

Class D output amplifiers are now commonplace in modern digital audio systems, as well as in other systems that drive output loads with signals generated from digital signal processing. As known in the art, class D output amplifiers include half-bridge and full-bridge push-pull output stages that are driven digitally, for example by way of pulse-width modulation (PWM). At sufficiently high PWM frequencies, class D amplifiers can drive output loads, such as audio speakers, at precision and fidelity equal to conventional analog output stages, and at high output power levels.

In the audio field, as well as in other applications, a common measure of output fidelity is total harmonic distortion (THD). The conventional definition of THD is the ratio of the sum of the powers of all harmonic frequencies above the fundamental output frequency, to the power at the fundamental frequency itself. Other somewhat equivalent definitions express THD as a ratio of the sum of the harmonic amplitudes (square root of the sum of the harmonic powers) to the amplitude of the fundamental. THD is typically expressed as a percentage, or in decibels (dB). Distortion is exhibited, in the time domain, by deviations from a pure sinusoid at the output load.

Filterless class-D output amplifiers are especially susceptible to THD at low output levels, which correspond to low duty cycles in the PWM domain. FIG. 1 illustrates a conventional filterless class D output amplifier 2 that has this susceptibility. Amplifier 2 has a conventional full-bridge (or "H-bridge") output in this example, with both sides of load 11 driven by a separate push-pull output stage. Because amplifier 2 is a class D amplifier, the output energy applied to load 11 will be defined by the duty cycle at which a differential voltage is applied across load 11. The push-pull output stages essentially apply a rail-to-rail output swing.

Integrating differential amplifier 4 receives a differential input signal to amplifier 2, across its nodes IN+, IN−, and produces a differential output signal at nodes P_IN, N_IN. Integration is accomplished by capacitive feedback from the outputs of differential amplifier 4 to its inputs; resistive feedback via resistors 3P, 3N from the output of the H-bridge is also applied in the conventional manner. The voltage at node P_IN will control the drive applied to node P at one side of load 11, while the voltage at node N_IN will control the drive applied to node N at the opposite side of load 11. The P-side drive circuit includes comparator 6P, which compares the positive side output P_IN from integrating differential amplifier 4 to a ramp or triangle reference waveform produced by reference waveform generator 5, thus effectively converting the level on line P_IN to a pulse-width modulated signal at the frequency of the reference waveform. Typically, the frequency established by the reference waveform (i.e., the PWM frequency) is much higher than the highest frequency of interest in the differential input signal, such that the differential input signal level at nodes IN+, IN− is essentially constant within a given single PWM cycle. The pulsed output of comparator 6P is applied to deglitch function 8P, which filters timing glitches from the pulsed signal in the conventional manner. Dead-time drive circuit 9P converts the pulsed output from comparator 6P into high-side drive signal P_HS and low-side drive signal P_LS, and enforces a "dead time" at transitions of the output signal. During the dead time, both of the pull-up and pull-down devices P_PU and P_PD are held off to ensure that both are not turned on at the same time, which would result in inefficient and potentially damaging rail-to-rail crowbar current through the output stage. Pull-up output transistor P_PU is, in this example, an n-channel MOS transistor with its drain at the $V_{dd}$ power supply voltage and its source at node P; pull-down output transistor P_PD is also an n-channel MOS transistor, and has its drain at node P and its source at ground. High-side drive signal P_HS from drive circuit 9P drives the gate of pull-up transistor P_PU and low-side drive signal P_LS drives the gate of pull-down transistor P_PD. Node P is connected to load 11.

The N-side circuitry of amplifier 2 includes comparator 6N, deglitch circuit 8N, dead-time drive circuit 9N, and a push-pull output stage of pull-up transistor N_PU and pull-down transistor N_PD, all connected in similar manner as the corresponding functions in the high-side circuitry of amplifier 2. However, as evident from FIG. 1 and as known in the art, the operational difference between the P-side and N-side drive circuits 9P, 9N in amplifier 2 stems from the differential voltage at the output of integrating differential amplifier 4. For example, during positive-polarity half-cycles of a sinusoidal input signal, the differential voltage at input nodes IN+, IN− is amplified by integrating differential amplifier 4 to a positive polarity differential signal at nodes P_IN, N_IN. This causes node P_COMP at the output of comparator 6P to be driven high earlier and for a longer pulse width than node N_COMP at the output of comparator 6N, because node P_IN is at a higher voltage than node N_IN during positive half-cycles. Accordingly, during a positive half-cycle of the input signal, there will be some period within each PWM period (i.e., the period of the ramp from generator 5) during which node P will be pulled high by transistor P_PU while node N is pulled low by transistor N_PD. Conversely, negative polarity half-cycles of the input signal, there will be some period within each PWM period during which node N will be driven high by transistor N_PU while node P is pulled low by transistor P_PD. These differential voltage pulses applied across load 11 will replicate the input signal as audible output, in the case where load 11 is an audio speaker.

It has been observed, however, that distortion is caused in this conventional arrangement as a result of the "dead time" enforced by drive circuits 9P, 9N. This distortion is especially noticeable at low amplitude input signal levels. FIG. 2 illustrates, by way of a timing diagram, the operation of conventional amplifier 2 in the event of such a low level audio signal. The time period illustrated in FIG. 2 corresponds to approximately one period of the reference ramp waveform REF output by generator 5. Prior to time t0 within this period, the instantaneous amplitude of the reference waveform REF from generator 5 is higher than both voltages on lines P_IN, N_IN, causing both comparators 6P, 6N to issue low output levels at nodes P_COMP, N_COMP, respectively. In turn, drive circuits 9P, 9N have both issued low-side drive signals active ("P-LS ACTIVE" and "N-LS ACTIVE"), turning on pull-down transistors P_PD, N_PD, respectively. At time t0, the instantaneous amplitude of the output of generator 5 falls below the voltage at node P_IN, resulting in a high-level output from comparator 6P at node P_COMP, while node N_COMP remains at a low level, reflecting the differential voltage output between nodes P_IN and N_IN from integrating differential amplifier 4. This high level at node P_COMP causes drive circuit 9P to turn off pull-down transistor P_PD. Because of dead-time DT enforced by drive circuit 9P, pull-up transistor P_PU is not immediately turned on, but both of transistors P_PU, P_PD are held off until dead-time DT elapses. At time t1, node N_IN exceeds the triangle amplitude, and comparator 6N issues a high level at its output node N_COMP. In response, drive circuit 9N turns off pull-down transistor N_PD, but turns on pull-up transistor N_PU only after dead time DT elapses.

The difference in time between node P_COMP going high (at time t0) and node N_COMP going high (at time t1) thus corresponds to the differential input voltage at inputs IN+, IN−. Ideally, this time differential would be reflected by a corresponding differential pulse across load 11, for example as shown by line ΔPN (desired) in FIG. 2. However, the combination of the dead-time DT and the non-ideal response of load 11 distorts the output pulse from its ideal duration that would correspond to the low-level differential input signal, as shown in FIG. 2. After time t1, when both of drive circuits 9P, 9N are in their dead-time, the voltage of nodes P and N across load 11 equalize, typically to ground by virtue of the load from source-drain capacitance. At time t2, when the P-side dead-time DT ends by drive circuit 9P turning on pull-up transistor P_PU ("P-HS ACTIVE" in FIG. 2), node N is still at a high-impedance state. The high-side drive from pull-up transistor P_PU pulling up node P at this time couples through load 11, and pulls up the voltage of node N, which is floating at this time. This coupling of the high-side drive through load 11 zeroes any differential signal that would have ideally been produced, as indicated by the duration labeled ERR in FIG. 2. Upon the N-side dead-time DT elapsing, at time t3, drive circuit 9N turns on its pull-up transistor N_PU ("N-HS ACTIVE"), which maintains nodes P and N across load 11 at the same high level.

The operation is similar in the second half of the PWM cycle, for the high-to-low transition of nodes P and N. Because the voltage at node N_IN is lower than that at node P_IN for this input signal level, node N_COMP at the output of comparator 6N makes a high-to-low transition at time t4, followed by the high-to-low transition of node P_COMP at time t5. However, drive circuit 9N again enforces dead-time DT. During the time between t4 and t5 that pull-up transistor P_PU remains on while drive circuit 9N is in its dead-time, the driving of node P high couples through load 11 to floating node N, eliminating any differential voltage to build up across load 11. This duration is also labeled in FIG. 2 as error ERR. Once both nodes N and P are at high-impedance states during the common dead-time between time t5 and t6, nodes N and P are at the same potential, shorted together by load 11. At time t6, the N drive dead-time DT elapses, following which pull-down transistor N_PD turns on ("N-LS ACTIVE"), pulling both of nodes N and P low; finally, at time t7, pull-down transistor P_PD is turned on as the P drive dead-time elapses ("P-LS ACTIVE").

The combination of the dead-time DT with the short output pulse width for this low level input signal has the result of distorting the output drive applied to load 11. This distortion results from the coupling of the drive voltage from one side of load 11 (the P side, in this example) to the side of load 11 that is floating because of the high-impedance state at node N during its dead-time DT. This one-sided drive eliminates any differential signal across load 11. If dead-time DT were zero, the differential voltage across nodes P_IN, N_IN at the output of integrating differential amplifier 4 would be exactly reflected in the times during which node P_COMP was at a high level and node N_COMP was at a low level. In the example of FIG. 2, these times are the durations between time t2 and time t3, and between time t4 and time t5 during which the ideal differential voltage pulses at nodes P, N across load 11 are shown by "ΔPN (desired)". However, the dead-times DT in the operation of the practical circuit of FIG. 2 prevent this differential voltage from appearing across load 11. In this extreme example, there is no time during the cycle at which node P is driven high while node N is pulled low. As a result, no differential pulse whatsoever appears across load 11 in this PWM cycle, as shown in FIG. 2 by the line "ΔPN (actual)". The energy applied to load 11 therefore does not correspond to the level requested by the signal at the outputs of integrating differential amplifier 4.

Harmonic distortion results from this discrepancy between the output energy applied to load 11 and the desired input signal. FIG. 3 illustrates the result for a constant tone (single sinusoid) input signal at a frequency significantly lower than the PWM frequency of reference waveform generator 5. Ideal sinusoidal waveform 13 represents this tone without distortion, and thus represents the ideal case in which the output signal identically matches an input sinusoidal signal. Waveform 15 represents an example of the output waveform corresponding to energy applied to load 11 by a conventional circuit such as that described above relative to FIGS. 1 and 2. As evident at the zero-crossing point, the signal amplitude flattens because of the inability of that conventional circuit to apply energy to load 11 at low input signal levels. A similar flattening will occur as the output goes negative at the beginning of a negative polarity half-cycle of the input signal. In the case of an audio signal, this flattening of the sinusoid from the intended signal amounts to distortion.

Those skilled in the art will recognize that a shorter dead-time will lower the minimum signal level for which the circuit will produce a differential output signal to the load, and will also reduce the extent of the dead-time distortion. However, a shorter dead-time increases the possibility of damaging "crowbar" current being conducted through the push-pull output drivers. Such short dead-times are especially risky especially if the circuit is being manufactured in high quantities, considering the effects of process variations.

By way of further background, it has been observed, according to this invention, that distortion resulting from drive circuit dead-time also occurs at larger input signal amplitude levels. FIG. 9 illustrates an example of the manner in which distortion due to drive circuit dead-time occurs for large input signal amplitudes, over a positive half-cycle of the input signal. In this example, the input differential signal received at nodes IN+, IN− in amplifier 2 of FIG. 1 is reasonably large, as evident by the larger difference in time between the transition at node P_COMP (at time t0 in FIG. 9) and the transition at node N_COMP (time t2 in FIG. 9) than that difference shown in FIG. 2. More specifically, in the larger signal amplitude example of FIG. 9, this difference between comparator output transition times is larger than dead-time DT (which, for the P-side drive circuit 9P, runs from time t0 to time t1 in FIG. 9).

As shown in FIG. 9 and as mentioned above, the low-to-high transition at the output of comparator 6P occurs at time t0, which initiates the dead-time DT at node P, during which drive circuit 9P turns off both of transistors P_PU and P_PD. During this time, because the low-side drive N_LS is pulling node N low, the high impedance state of drive circuit 9P allows node P to be held low via load 11. Ideally, if no dead-time DT were enforced, drive circuit 9P would drive node P high beginning at time t0, establishing a differential voltage between nodes P and N beginning at time t0 and continuing until the transition of N_COMP at time t2. This ideal differential voltage pulse is shown on line ΔPN (desired) of FIG. 9, having a duration p. Instead, because of the dead-time DT, the differential voltage pulse ΔPN (actual) does not begin until time t1, continuing to time t2 (and thus having a duration of p-DT). At time t2, node N_COMP makes its low-to-high transition, initiating the dead-time at node N, allowing the high-side active drive at node P to pull up the voltage at node N via load 11. This ends the differential voltage across load 11.

A similar error in the differential voltage across load 11 occurs at the trailing transition in the latter half of the PWM cycle. At time t3, node N_COMP makes a high-to-low transition, again initiating the dead-time at node N. Because of the high-side active drive at node P, however, the voltage at node N remains high until the N-side dead-time elapses at time t4. Accordingly, at time t4, drive circuit 9N drives its low-side output N_LS active, turning on transistor N_PD and pulling node N low, while node P continues to be driven high by drive circuit 9P. This establishes a differential voltage across load 11 until time t5, at which time node P_COMP makes its high-to-low transition, allowing driven node N to pull down node P via load 11 during the P-side dead-time DT. Again, the ideal differential voltage pulse for this input signal level would run from time t3 to time t5 (duration P in FIG. 9); the dead-time DT reduces this differential voltage pulse to only run from time t4 to time t5. While the ideal PWM output pulse width would amount to 2p, the actual output pulse width is instead 2p-2DT—the actual output pulse width is distorted by twice the dead-time.

As such, it has been observed, according to this invention, that the provision of dead-time not only affects the low signal amplitude signals, but also reduces the fidelity of larger amplitude signals, as well.

BRIEF SUMMARY OF THE INVENTION

It is therefore an object of this invention to provide a class D output driver circuit and method of operating the same that exhibits reduced harmonic distortion at low signal levels.

It is a further object of this invention to provide such a circuit and method that reduces harmonic distortion also at higher signal levels.

It is a further object of this invention to provide such a circuit and method that is robust to manufacturing variations.

It is a further object of this invention to provide such a circuit and method that can be implemented at modest cost, without undue circuit complexity.

It is a further object of this invention to provide such a circuit and method that is capable of adapting to variations in the load impedance.

Other objects and advantages of this invention will be apparent to those of ordinary skill in the art having reference to the following specification together with its drawings.

The present invention may be implemented into a class D differential output driver circuit, in which a dead-time is enforced at push-pull output stages. Logic circuitry senses disturbances in the output of low input level amplitudes, and in such events adds a differential pulse to the output of a comparator to ensure the delivery of energy to the load. The added differential pulse can correspond to an estimate of the desired differential output, or to a measure of the desired output pulse plus the dead-time duration. A reasonable dead-time at the push-pull drivers can remain in place, while the distortion resulting from one-sided drive is compensated by the additional differential pulse. According to another aspect of the invention, dead-time error in large signal level output is also detected and corrected.

BRIEF DESCRIPTION OF THE SEVERAL VIEWS OF THE DRAWING

FIG. 6 is a timing diagram illustrating the operation of the circuit of FIG. 4 according to this embodiment of the invention.

DETAILED DESCRIPTION OF THE INVENTION

The present invention will be described in connection with certain embodiments, namely as implemented into a digital audio amplifier. However, it is contemplated that this invention can also provide important benefits if applied in connection with other circuit and system applications for class D amplifiers. Accordingly, it is to be understood that the following description is provided by way of example only, and is not intended to limit the true scope of this invention as claimed.

Figure 4:
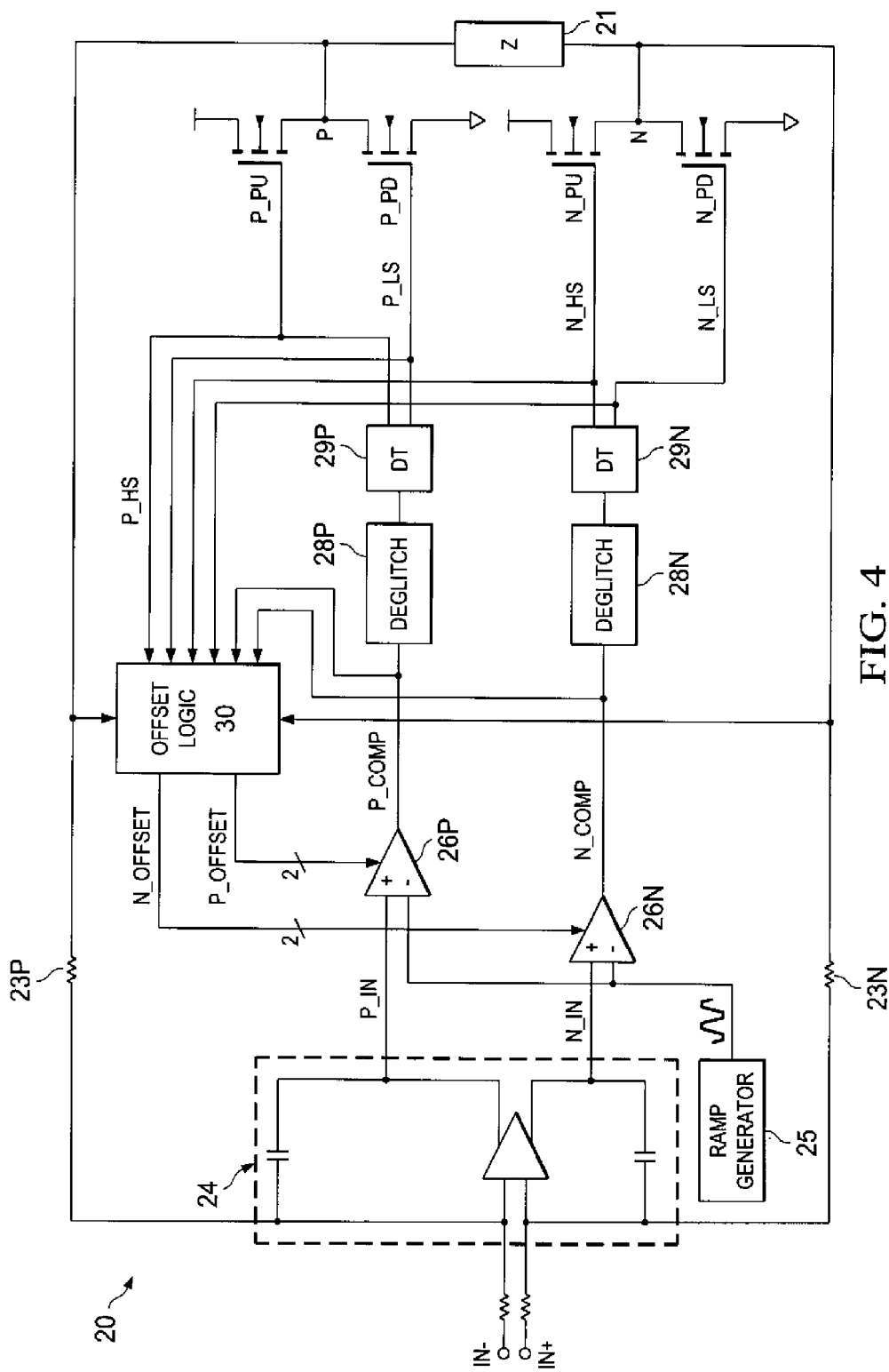
FIG. 4 is an electrical diagram, in block and schematic form, illustrating an H-bridge class D differential output drive circuit according to embodiments of the invention.

Referring now to FIG. 4, the construction of an example of amplifier 20 according to embodiments of the invention will now be described. Amplifier 20 in this example corresponds to a digital audio amplifier driving a loudspeaker or other device producing audible output. It is contemplated that amplifier 20 of FIG. 4 will typically be implemented as the output stage for a channel of a larger-scale digital audio system, such as a digital audio or audio/visual receiver, audio output circuitry for computers, televisions, or other systems, digital audio players including portable digital audio players (e.g., MP3 players), and the like. In this example, the audio signal to be applied to the eventual audio output device (load 21 in this example) is received by amplifier 20 at differential analog input terminals IN+, IN−, which are coupled by respective series resistors to corresponding inputs of integrating differential amplifier 24.

As shown in FIG. 4, integrating differential amplifier 24 is constructed as a conventional differential amplifier, with a first-order integrating feedback loop coupled to each input from its corresponding output. FIG. 4 also illustrates resistive feedback to the differential inputs from the H-bridge output, via resistors 23P, 23N, in the conventional manner. While the feedback network incorporated into integrating differential amplifier 24 may be higher than first order, if desired, it is contemplated that this invention will permit integrating differential amplifier 24 to be constructed in a relatively modest fashion (e.g., first order integrator) while still providing a high fidelity output. As such, it is contemplated that integrating differential amplifier 24 may be kept relatively simple, with first or second order characteristics. Integrating differential amplifier 24 presents a corresponding differential signal at its outputs P_IN, N_IN. For a positive polarity differential signal, integrating differential amplifier 24 will drive output P_IN to a higher voltage than output N_IN; the inverting operation of amplifier 24 is comprehended in FIG. 4 by the arrangement of inputs IN+, IN−.

According to this embodiment of the invention, comparators 26P, 26N receive outputs P_IN, N_IN, respectively from integrating differential amplifier 24, and also receive offset signals P_offset, N_offset, respectively from offset logic 30, as will be described below. In this embodiment of the invention, each of offset signals P_offset, N_offset are differential signals communicated over a pair of signal lines. As will be evident from the following description, offset signal P_offset will apply the appropriate offset correction for positive half-cycles of the input audio signal IN+, IN−, while offset signal N_offset will apply the appropriate offset correction for negative half-cycles of that input signal.

According to this embodiment of the invention, comparators 26P, 26N are effectively four-input comparators that each present an output logic level, on lines P_COMP, N_COMP respectively, corresponding to the result of the comparison of the voltages at their inputs. In this example, the negative inputs of each of comparators 26P, 26N receive a reference signal in the form of a reference waveform at a high frequency (relative to the highest frequency of interest in the input signal at lines IN+, IN−), generated by reference waveform generator 25. For purposes of clarity, this description will refer to this reference waveform as a voltage ramp, although other time-varying reference waveforms such as a sawtooth wave can alternatively be used. The frequency of the signal produced by reference waveform generator 25 is, effectively, the pulse-width-modulation (PWM) frequency at which load 21 will be driven.

As a result of this construction, comparators 26P, 26N will each produce, at their outputs P_COMP, N_COMP respectively, a digital pulse within each period of the reference waveform at a duty cycle corresponding to the duration at which their respective inputs P_IN, N_IN have an amplitude higher than that of the reference ramp waveform, as may be modified by offset signals P_offset, N_offset, respectively. For purposes of this description, positive logic levels will be assumed throughout amplifier 20. In that case, a positive polarity differential input signal at lines IN+, IN− will be reflected as a positive polarity signal across lines P_IN, N_IN. In response to this positive polarity differential input signal, comparator 26P will produce a pulse on line P_COMP that is longer in time, than will be the pulse on line N_COMP produced by comparator 26N, considering that comparators 26P, 26N simultaneously receive the same reference waveform. Conversely, a negative polarity input differential signal will result in a longer pulse on line N_COMP than on line P_COMP. In either case, the pulses on lines P_COMP, N_COMP will be generally symmetric about the same point in time as one another (assuming variations in the input signal are at much lower frequencies than the triangle frequency), as both are generated responsive to the same reference signal. As will be apparent from the following description, this difference in differential pulse width will be reflected at load 21.

Amplifier 20 is arranged in the conventional H-bridge manner, driving both sides of load 21 from nodes P and N shown in FIG. 4. In this example, the "P" side of load 21 at node P is driven in response to the output of comparator 26P, and the "N" side of load 21 at node N is driven in response to the output of comparator 26N. On the P side, output P_COMP from comparator 26P is received by deglitch function 28P, which filters glitches from the pulsed signal in the conventional manner. Dead-time drive circuit 29P receives the deglitched signals from function 28P, and converts these pulses into high-side drive signal P_HS and low-side drive signal P_LS. High-side drive signal P_HS is applied to the gate of n-channel MOS pull-up transistor P_PU, which has its drain at the $V_{dd}$ power supply voltage and its source at drive node P; low-side drive signal P_LS is applied to the gate of n-channel MOS pull-down transistor P_PD, which has its drain at drive node P and its source at ground. Drive circuit 29P enforces a "dead time" between the times at which high-side drive signal P_HS is driven active and the times at which low-side drive signal P_LS, to ensure that the push-pull output devices P_PU and P_PD are not simultaneously on.

Similarly, the N side of the H-bridge is controlled by comparator 26N, which presents pulses on output N_COMP to deglitch function 28N. Dead-time drive circuit 29N produces high-side drive signal N_HS that is applied to the gate of n-channel MOS pull-up transistor N_PU. Transistor N_PU also has its drain at the $V_{dd}$ power supply voltage and its source at drive node N, while n-channel MOS pull-down transistor N_PD has its drain at drive node N and its source at ground. Transistor N_PD receives low-side drive signal N_LS from drive circuit 29N at its gate. As such, drive circuit 29N receives pulses corresponding to the output of comparator 26N from function 28N, and converts these pulses into high-side drive signal N_HS and low-side drive signal N_LS. Drive circuit 29N also enforces a "dead time" at transitions to prevent crowbar current through push-pull output devices N_PU and N_PD, as would occur if these devices were both on at the same time.

As discussed above, load 21 is connected across nodes P, N. Energy is delivered to load 21 during those times at which nodes P, N are at different voltages from one another. As discussed above, the duration of such a differential voltage at nodes P, N corresponds to the portion of the PWM period during which the outputs of comparators 26P, 26N differ from one another, and thus corresponds to the differential voltage at the output of integrating differential amplifier 24.

According to the circuit of FIG. 4 in these embodiments of the invention, offset logic 30 is provided to correct for errors in the differential voltage pulse width across nodes P and N caused by the dead-time enforced by drive circuits 29P, 29N. In this example, offset logic 30 receives inputs from the high-side and low-side drive nodes from both P-side drive circuit 29P and N-side drive circuit 29N. As will be described below, offset logic 30 produces correction signals that are applied as "offsets" to comparators 26P, 26N. These correcting offsets affect the time duration at which comparators 26P, 26N produce high level output pulses (from the comparison of the respective inputs P+, N+ to the reference ramp signal), and will thus affect the pulse width of drive to nodes P, N.

According to this embodiment of the invention, as discussed above, offset logic 30 generates offset signal line pairs P_offset, N_offset applied to comparators 26P, 26N, respectively, to correct for disturbances in the output pulses at small signal amplitudes. These disturbances result from the inability of the drive circuits to establish a differential voltage at nodes P, N because of coupling through load 21, in the manner described above in connection with FIGS. 2 and 3 as caused by the non-zero dead-time enforced by drive circuits 29P, 29N. And as will also be described below, offset logic 30 also generates correction signals P_offset, N_offset, that correct pulse width errors caused by the dead-time itself.

Figure 1:
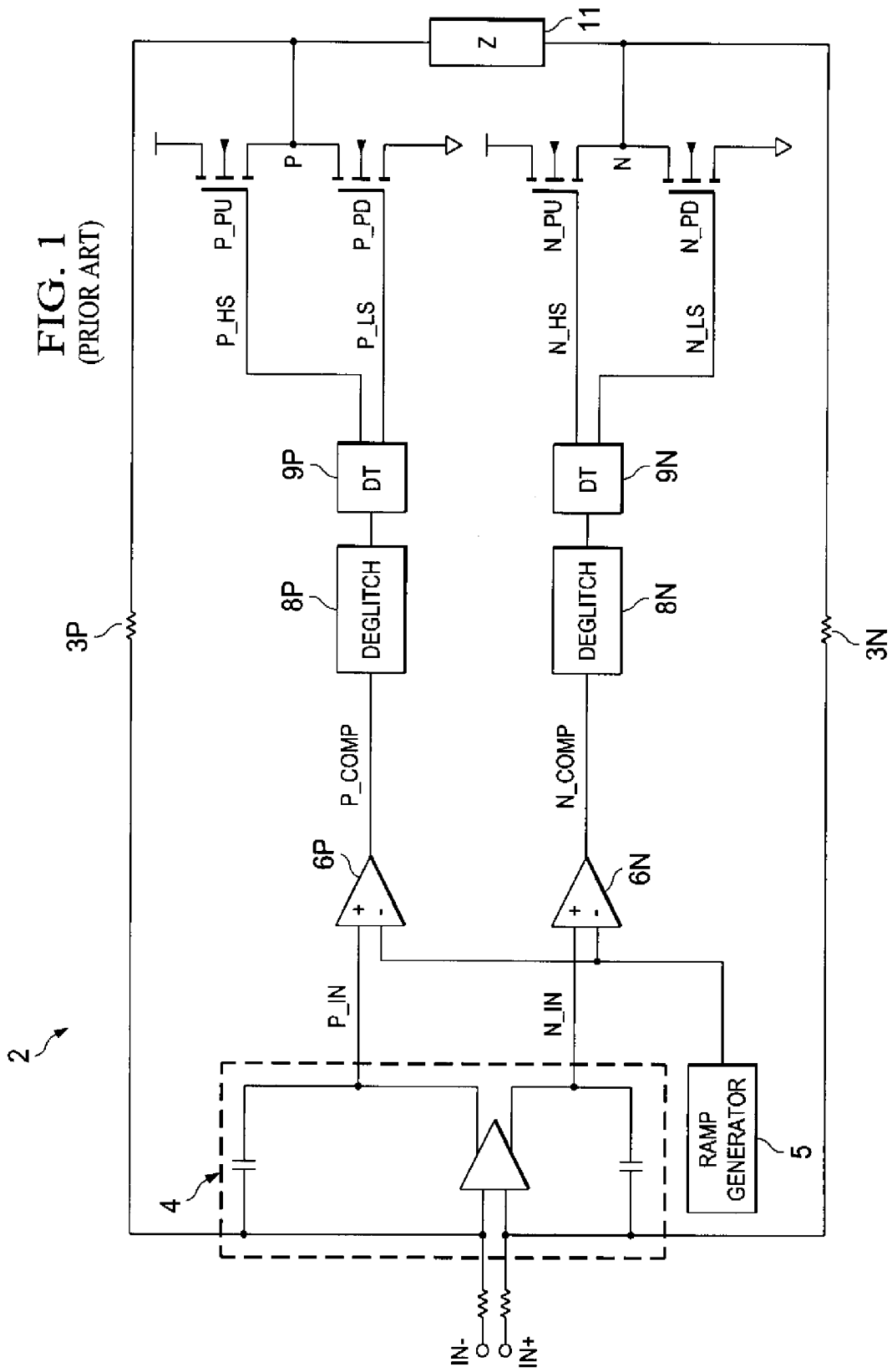
FIG. 1 is an electrical diagram, in schematic form, illustrating a conventional H-bridge class D differential output drive circuit.
Figure 5:
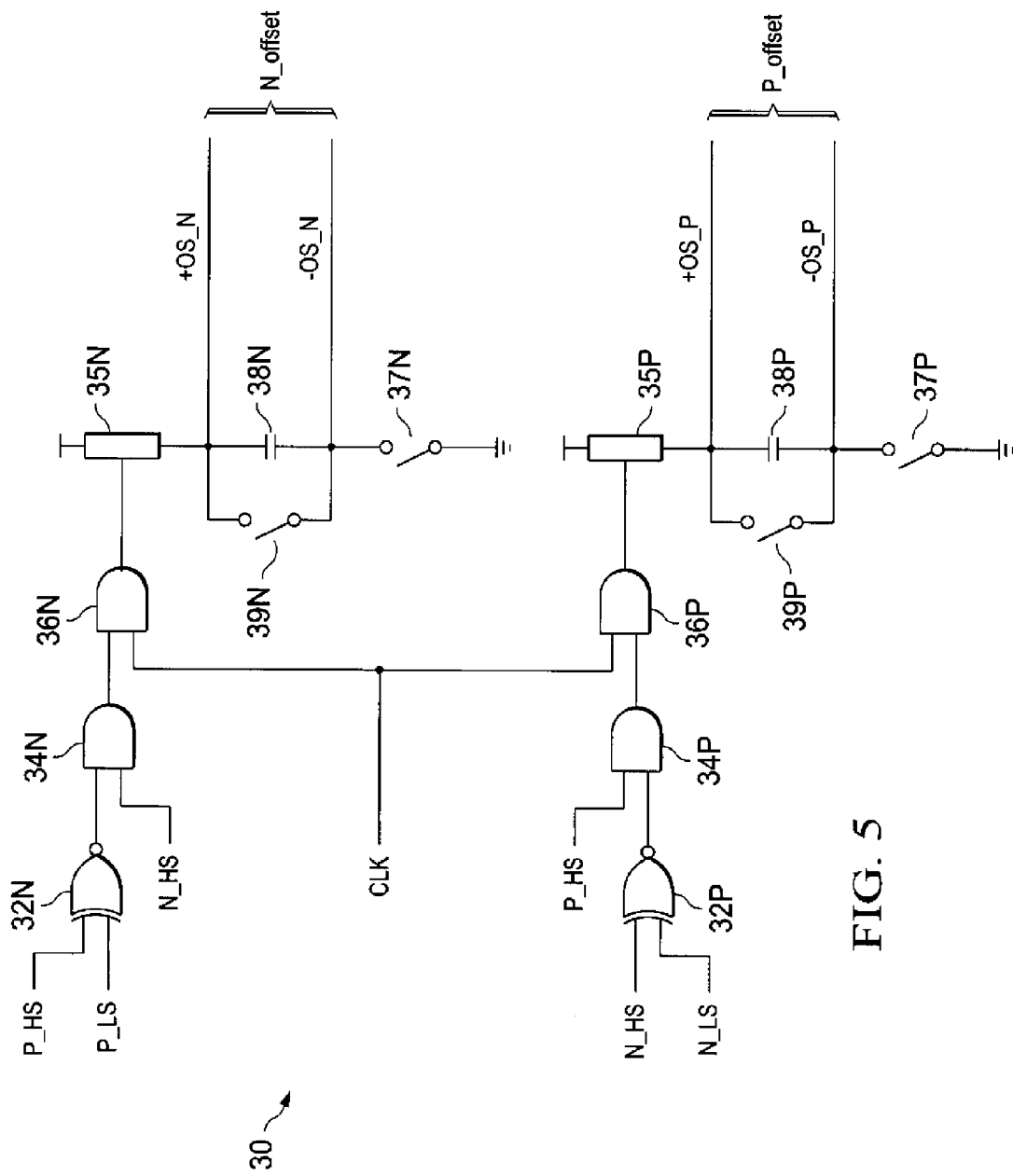
FIG. 5 is an electrical diagram, in schematic form, illustrating the construction of small signal offset logic in the circuit of FIG. 4 according to an embodiment of the invention.

Referring now to FIG. 5, the construction of offset logic 30 according to a first embodiment of this invention will now be described. As discussed above relative to the conventional circuit of FIG. 1, the eventual output differential voltage at the load of a conventional amplifier circuit is suppressed because of coupling through the load itself during drive circuit dead-time, while one side of the load is floating. With reference to the small-signal case of FIG. 2, the desired differential voltage pulse ΔPN (desired) corresponding to node P_COMP being high and node N_COMP being low does not appear, because the floating end of the load during dead-time is pulled to the high level of the driven end, thus eliminating any differential voltage from appearing at that time. This results in a distorted output signal.

Offset logic 30 shown in FIG. 5 addresses this distortion. Exclusive-NOR gate 32P receives inputs from the N-side drive nodes, specifically the outputs N_HS and N_LS from drive circuit 29N. The output of XNOR gate 32P is applied to an input of AND gate 34P. AND gate 34P receives line P_HS from the output of drive circuit 29P at its other input. The output of AND gate 34P is coupled to an input of AND gate 36P, which receives a clock signal CLK at its other input. Clock signal CLK is synchronous with the reference waveform at the PWM frequency. Capacitor 38P is connected between the $V_{dd}$ power supply voltage and ground, via (n-channel) pass gate 35P and switch 37P, respectively. The output of AND gate 36P is connected to the gate of pass gate 35P so that, with switch 37P closed, capacitor 38P is charged from the $V_{dd}$ power supply voltage during such time that the output of AND gate 36P is at a high logic level. Typically, some resistance will be included within or in addition to pass gate 35P, for current limiting purposes. Reset switch 39P is connected across capacitor 38P, and is controlled by a reset signal. The voltage across capacitor 38P thus defines the voltage of node P_offset, which is communicated to comparator 26P via signal lines +OS_P, −OS_P, to modulate the duration of the output pulse from comparator 26P, as will be described below.

This circuitry is replicated within offset logic 30, in converse fashion, to generate a voltage across capacitor 38N that is applied to comparator 26N. XNOR gate 32N receives, at its inputs, the outputs P_HS and P_LS from drive circuit 29P. The output of XNOR gate 32N is applied to an input of AND gate 34N, which receives line N_HS from drive circuit 29N at its other input. The output of AND gate 34N is clocked by master PWM clock CLK through AND gate 36N, which drives pass gate 35N to charge capacitor 38N, which has its other plate coupled to ground via switch 37N. Reset switch 39N is connected across capacitor 38N, and is controlled by a reset signal. As in the case of capacitor 38P, the voltage across capacitor 38N determines an offset to be applied to comparator 26N via lines N_offset (+OS_N, −OS_N).

Referring now to FIG. 6, the operation of offset logic 30 will now be described, for the example of generating a cycle of the pulse-width modulated output signal during the positive half-cycle of the input signal at input nodes IN+, IN−, and more specifically at a point in that half-cycle at which the signal amplitude is small. As evident from this description, the frequency of the input signal is much lower than the pulse-width-modulation frequency, and thus the frequency of master clock CLK. In this description of a single cycle of the PWM output signal, therefore, the amplitude of the input signal can be considered to be effectively constant. The ramp waveform from generator 25 (not shown in FIG. 6) is at the PWM frequency. For purposes of this description, the portion of offset logic 30 for generating the offset voltage across capacitor 38N will be effectively inactive, because no correction is necessary for comparator 26N during positive-polarity half-cycles of the input signal.

In this example, clock signal CLK indicates the beginning of a PWM period with its low-to-high transition as shown; at this time, the ramp reference waveform (not shown) from generator 25 begins a negative-going ramp. At some time near the beginning of the PWM period, reset switches 39P, 39N are each closed, to discharge their respective capacitors 38P, 38N. At time t0, the reference waveform at the negative input of comparator 26P falls below the level of node P_IN. This causes output node P_COMP from comparator 26P to make a low-to-high transition at time t0. Drive circuit 29P then initiates its dead-time beginning at time t0, to avoid crowbar current through transistors P_PU, P_PD. Because node N_COMP does not make its low-to-high transition until time t1 (the voltage at node N_IN being below that of node P_IN), drive circuit 29N continues driving node N to ground (node N_LS is active high). The output of XNOR gate 32P is thus low between time t0 and time t1. At time t1, however, the ramp voltage crosses the voltage level at node N_IN, and comparator 26N drives its output N_COMP to a high level. This transition is applied to drive circuit 29N, which now starts its dead-time, driving both of nodes N_HS and N_LS low, turning off transistors N_PU, N_PD, respectively, and placing node N in a high-impedance state. This N-side dead-time, indicated by nodes N_HS and N_LS both being low, is reflected by a high level at the output of XNOR gate 32P. At time t2, drive circuit 29P ends its dead-time, and drives node P_HS high (responsive to the high level at node P_COMP at the output of comparator 26P). This high level at node P_HS, in combination with the high output from XNOR gate 32P because of the N-side dead-time, results in a high level at the output of AND gate 34P (line 34P of FIG. 6). This high output of AND gate 34P, in combination with the high level of clock signal CLK during this first half-cycle, causes AND gate 36P to turn on pass gate 35P, charging capacitor 38P. FIG. 6 illustrates the voltage P_offset across capacitor 38P as charging from time t2 until about time t3, at which time the N-side dead-time ends, and drive circuit 29N drives its node N_HS active high, turning on transistor N_PU. The transition of node N_HS ripples through AND gate 34P and AND gate 36P, and opens pass gate 35P. The voltage across capacitor 38P is thus determined. For this instance, capacitor 38N is not charged at all, because there is no P-side dead time while node N_HS is active (the output of XNOR 32N is always high), forcing the output of AND gate 36N low throughout.

PWM clock CLK makes a high-to-low transition at the midpoint of the PWM cycle, which blocks both AND gates 36P, 36N from further charging capacitors 38P, 38N, respectively; at this time, the reference waveform begins a positive-going ramp. Because the PWM frequency is sufficiently high, relative to the highest frequency of interest in the input signal the pulses of active high levels at outputs P_COMP, N_COMP can be considered symmetric in time. Accordingly, the duration of the two disturbances, within this cycle, during which node P_COMP is active high while the opposite side of the H-bridge is in its dead-time, are assumed to be of equal duration p. And according to this embodiment of the invention, the length of the active high period of node P_COMP at the output of comparator 26P is extended by a time corresponding to twice this duration (i.e., a time 2p). Because of the assumption of symmetry, offset logic 30 will obtain an estimate of time p only from the first of the two disturbances (e.g., the time elapsed between time t2 and time t3 in FIG. 6); there is insufficient time to also sense the duration of this second disturbance between times t4 and 45, and to apply that sensed duration to the comparator. Capacitor 38P thus is sized to store sufficient charge to offset comparator 26P to account for the energy lost from both disturbances, as is capacitor 38N.

Amplifier 20 and offset logic 30 remain in the state following time t3 for such time as the voltages at inputs P_IN, N_IN are both above the ramp amplitude within this cycle. At the midpoint of the PWM cycle, between times t3 and t4, master PWM clock CLK returns to a low level, allowing the voltage at capacitor 38P to be applied to comparator 26P. At time t4, the positive-ramping amplitude of the ramp waveform crosses the voltage at node N_IN, causing the output of comparator 26N to make a transition from an active high level to a low logic level. The dead-time at node N is then initiated by drive circuit 29N, as before. Node P_COMP remains active high, because the ramp voltage has not reached a level sufficient to cause a transition at comparator 26P, and as such the high side drive of node P from drive circuit 29P continues.

Figure 12:
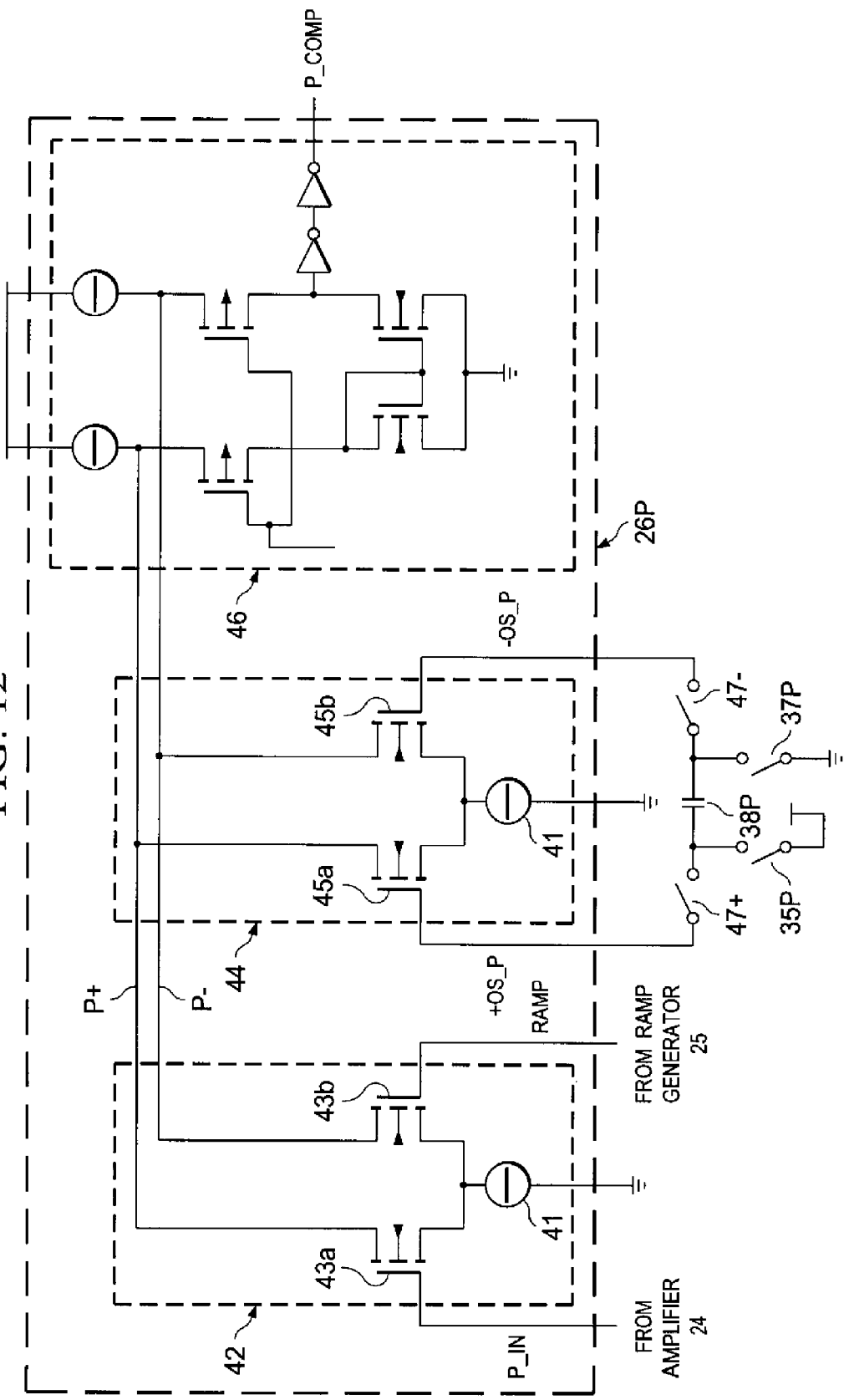
FIG. 12 is an electrical diagram, in schematic form, of comparators in the circuit of FIG. 4, according to embodiments of the invention.

FIG. 12 illustrates the construction of comparator 26P, in one example of this embodiment of the invention, by way of a simplified schematic diagram. Comparator 26N will, of course, be similarly constructed; in both cases, of course, it is contemplated that comparators 26P, 26N can be constructed according to alternative circuit arrangements. In this example, comparator 26P is constructed as a typical two-stage CMOS differential amplifier, with two differential input stages 42, 44 and output stage 46. Differential stage 42 includes a pair of MOS transistors 43a, 43b having their sources connected via shared current source 41 to ground; the gate of transistor 43a receives output P_IN from integrating differential amplifier 24, and the gate of MOS transistor 43b receives ramp reference waveform RAMP from ramp generator 25 at its gate. Similarly, differential stage 44 includes a shared current source 41, coupled between ground and the sources of MOS transistors 45a, 45b. The gates of transistors 45a, 45b receive the voltage across capacitor 38P of offset logic 30, via lines +OS_P, −OS_P, respectively, as connected by switches 47+, 47− (implemented as pass gates, for example). The drains of transistors 43a, 45a are connected together at a node P+, and the drains of transistors 43b, 45b are connected together at node P−. Nodes P+, P− are applied to output stage 46 of comparator 26P, which in this example is constructed as a conventional current mirror output stage that converts the differential voltage across nodes P+, P− into a single-ended output signal on line P_COMP. Of course, the construction of output stage 46 may vary from that shown in FIG. 12, and may take any one of a number of conventional forms.

In operation, comparison of the voltage at node P_IN to the instantaneous voltage of reference waveform RAMP establishes the contribution of differential stage 42 to the differential voltage across nodes P+P−. Differential stage 44 modulates this differential voltage according to the voltage across capacitor 38P, which is applied by switches 47+, 47− at the appropriate time in the PWM cycle. In the example of FIGS. 5 and 12 discussed above, the positive voltage to which capacitor 38P is charged corresponds to twice the estimate of the duration p of the disturbance caused by dead time in this small positive amplitude case. This voltage across capacitor 38P is applied by differential stage 44 as a positive offset to the result of the comparison of input P_IN to reference waveform RAMP from differential stage 42. This positive offset serves to lengthen the duration of the high active level at output P_COMP from comparator 26P, by a time corresponding to twice the estimate of the disturbance time, as discussed above.

Referring back to FIG. 6, this lengthening of the active high level at output P_COMP is illustrated as beginning at time t5, continuing for a duration estimated as twice the duration of the disturbance between times t2 and t3. In this example, the lengthened active high level at output P_COMP continues until time t7, as shown in FIG. 6. Because of this lengthening by offset logic 30, the high-side drive P_HS applied to the gate of P-side pull-up transistor P_PU continues beyond the end of the N-side dead time at time t6. Because of the falling transition of line N_IN, and after the dead-time has elapsed, the low-side drive N_LS becomes active at time t6. Accordingly, a differential voltage is applied across load 21 from time t6 to time t7, because node P is driven high by transistor P_PU and node N is pulled low by transistor N_PD during the interval from time t6 to time t7, as shown by line ΔPN (actual) in FIG. 6. After application of the charge (for example at the beginning of the next PWM period indicated by a transition of clock CLK), reset transistor 39P in small signal offset logic 30a discharges any residual charge on capacitor 38P, enabling accurate time measurement in the next cycle.

Figure 2:
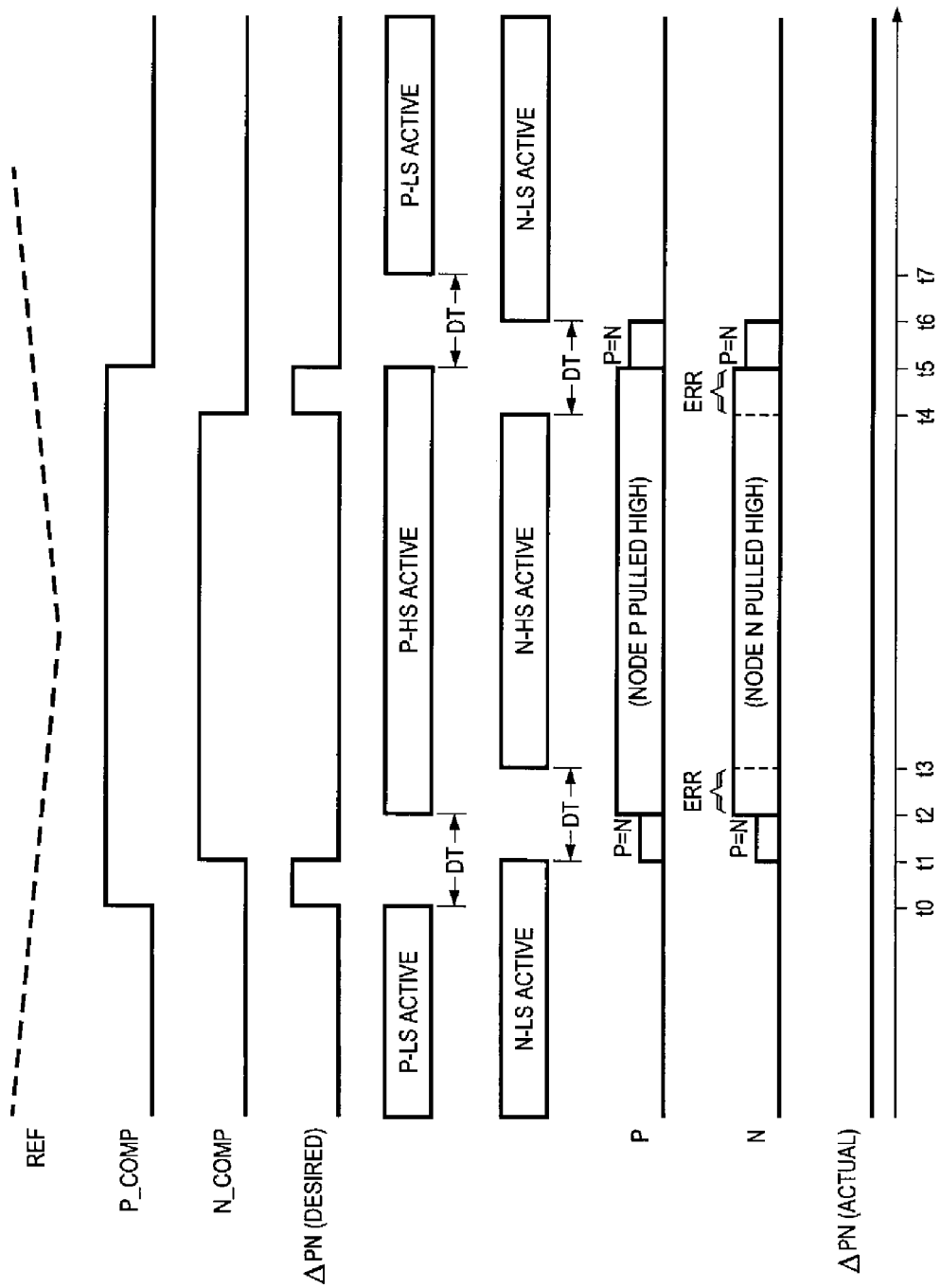
FIG. 2 is a timing diagram illustrating the operation of the conventional circuit of FIG. 1 in response to small input signal levels.
Figure 3:
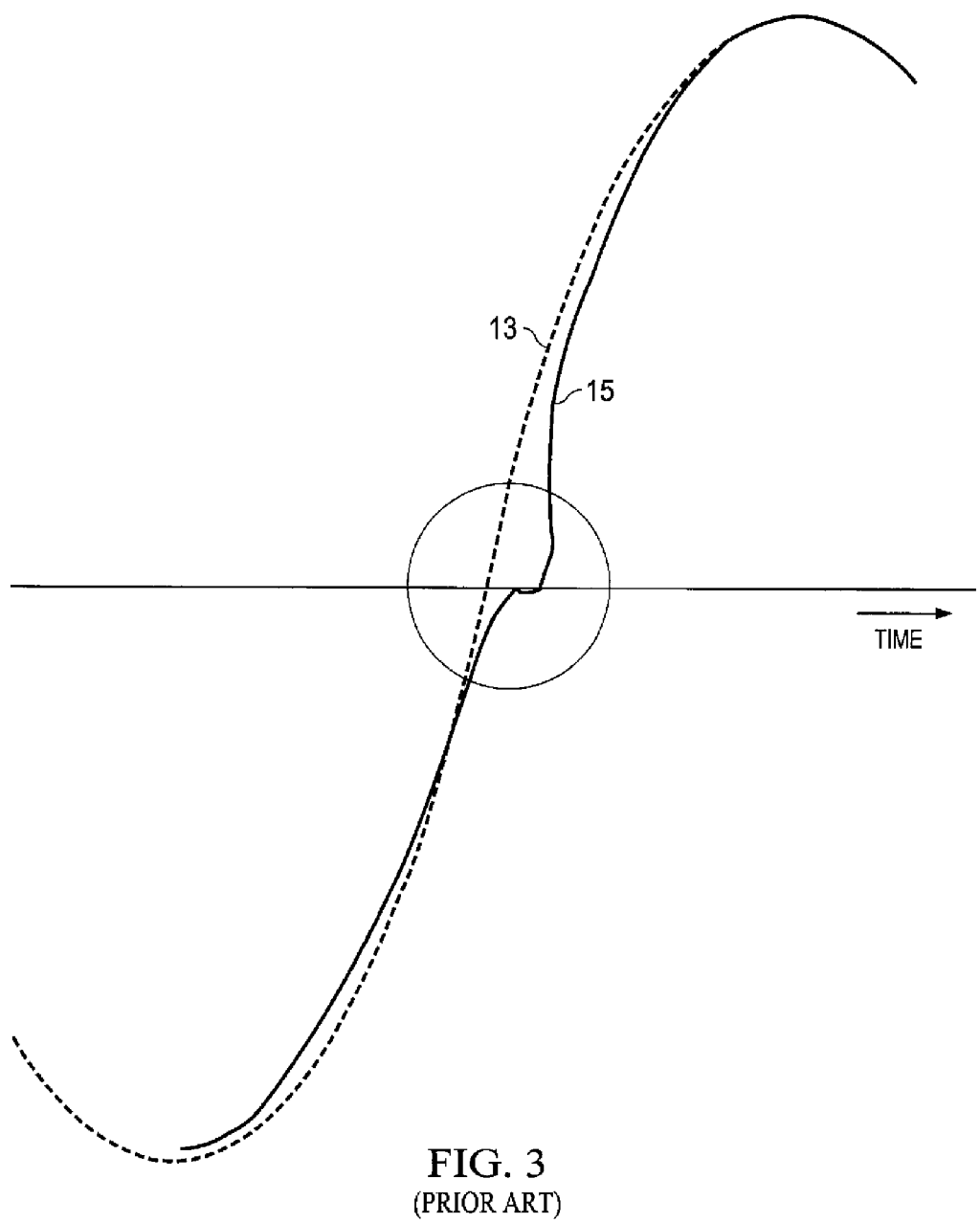
FIG. 3 is a waveform plot illustrating harmonic distortion caused by the operation of the conventional circuit of FIG. 1.

In contrast to the conventional operation illustrated in FIG. 2, in which no differential voltage is applied across load 11 for the illustrated low amplitude differential input signal, offset logic 30 of this embodiment of the invention ensures that some differential energy is applied to the load even in that situation. Harmonic distortion caused by the dead-time driver operation is thus reduced by this embodiment of the invention, without adding complexity to other functions such as the integrating differential amplifier 24.

Figure 7A:
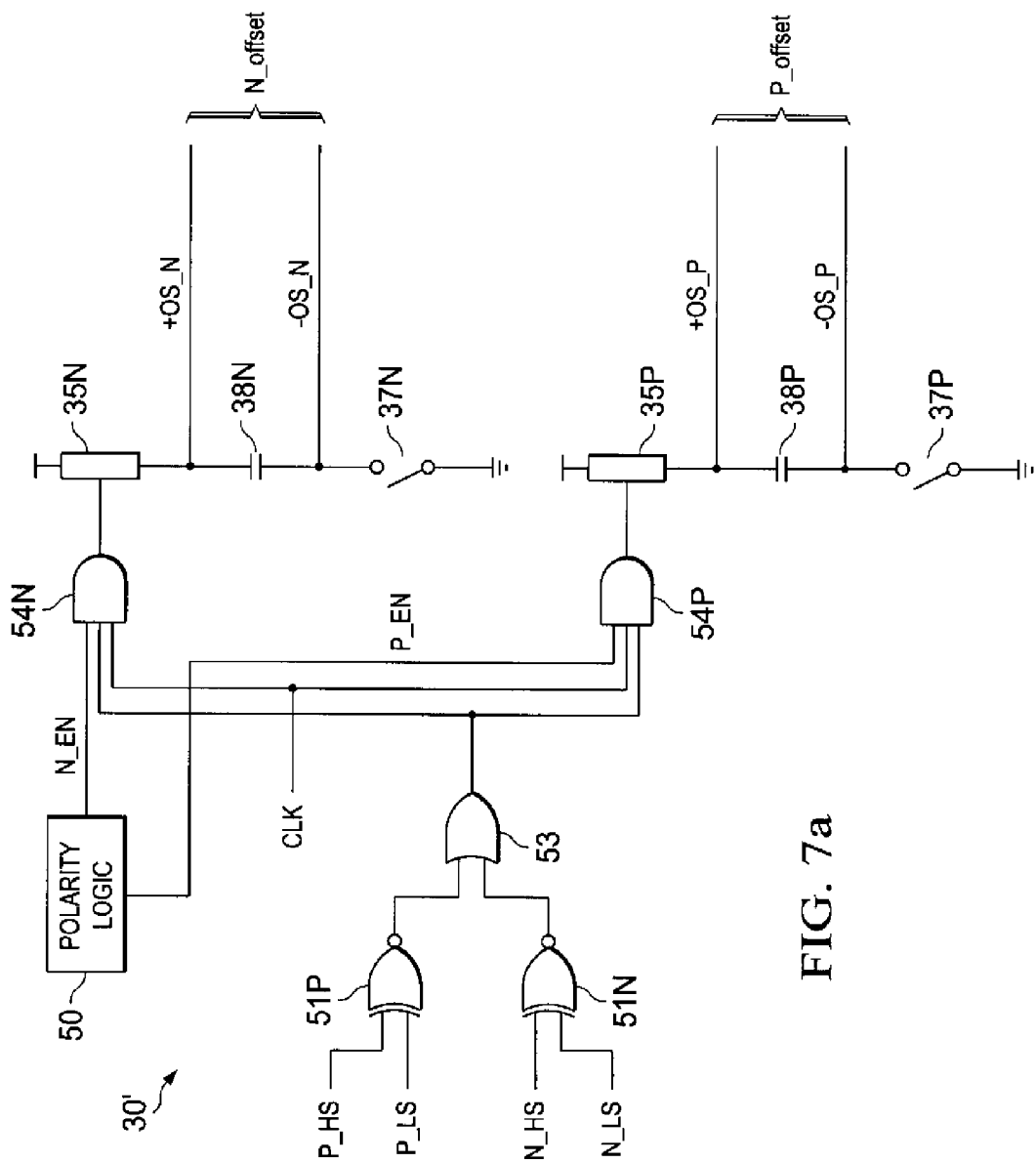
FIGS. 7a and 7b are electrical diagrams, in schematic form, illustrating the construction of small signal offset logic in the circuit of FIG. 4 according to another embodiment of the invention.

According to another embodiment of the invention, harmonic distortion of low amplitude signals due to dead-time is corrected by estimating the duration of the disturbance, as in the case of the circuit of FIG. 5, in combination with an estimate of the dead-time itself. FIG. 7a illustrates offset logic 30' according to this alternative embodiment of the invention, as will now be described. In this embodiment of the invention, offset logic 30' produces both an offset voltage P_offset and an offset voltage N_offset.

Offset logic 30' includes XNOR gates 51P and 51N. XNOR gate 51P receives the drive levels P_HS, P_LS from drive circuit 29P at its inputs, and XNOR gate 51N receives the drive levels N_HS, NLS from drive circuit 29N at its inputs. The outputs of XNOR gates 51P, 51N are connected to inputs of OR gate 53. The output of OR gate 53 is connected to an input of NAND gate 54P and an input of AND gate 54N. AND gate 54P receives clock signal CLK at a second input, and control signal P_EN from polarity logic circuit 50 at a third input; as will be described below, control signal P_EN indicates that the input audio signal has a positive amplitude (i.e., load 21 will be driven with a positive voltage at node P relative to node N). AND gate 54N similarly receives clock signal CLK at a second input and control signal N_EN from polarity logic circuit 50 at a third input, where control signal N_EN indicates that the input audio signal has a negative amplitude (i.e., load 21 will be driven with a positive voltage at node N relative to node P). The output of AND gate 54P controls pass gate 35P, for charging capacitor 38P; in similar fashion as described above in connection with offset logic 30 shown in FIG. 5. Similarly, the output of AND gate 54N controls pass gate 35N, which controls the charging of capacitor 38N for producing the offset voltage N_offset. As will be described below, during cycles in which a positive voltage is driven across load 21, AND gate 54P charges capacitor 38P with a voltage that is proportional to the sum of the dead-time enforced by P-side drive circuit 29P and the disturbance during which the P-side high-side drive is active during the N-side dead-time (between times t2 and t3 in FIGS. 6 and 8). The voltage across capacitor 38P is applied to inputs of comparator 26P in similar manner as described above relative to FIG. 12. Similarly, during cycles in which a negative voltage is driven across load 21, AND gate 54N controls the charging capacitor 38N to a voltage proportional to the sum of the dead-time enforced by N-side drive circuit 29P and the disturbance during which the N-side high-side drive is active during the P-side dead-time; the voltage across capacitor 38N is applied to inputs of comparator 26N in similar manner as described above relative to FIG. 12.

Figure 7B:
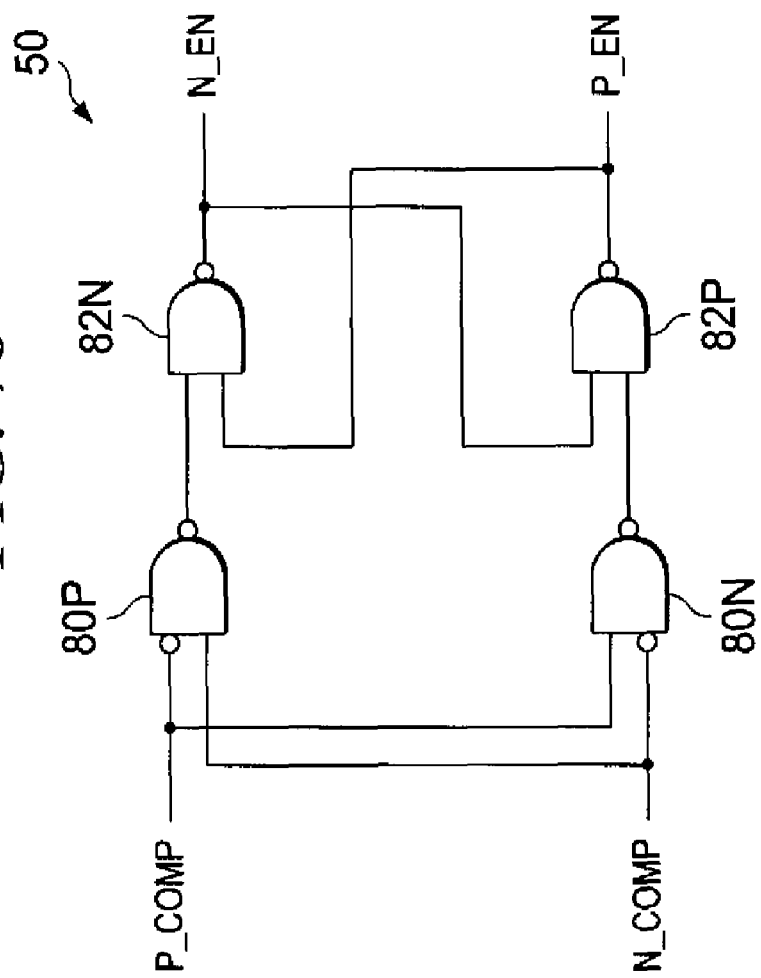

FIG. 7b illustrates an example of polarity logic circuit 50 for generating control signals P_EN, N_EN. Of course, many alternative realizations of polarity logic circuit 50 will be apparent to those skilled in the art having reference to this specification. As shown in FIG. 7b, NAND gate 80P receives output P_COMP from comparator 26P at an inverting input, and output N_COMP from comparator 26N at a non-inverting input; conversely, NAND gate 80N receives output P_COMP from comparator 26P at a non-inverting input, and output N_COMP from comparator 26N at an inverting input. The output of NAND gate 80P is applied to an input of NAND gate 82N, and the output of NAND gate 80N is applied to an input of NAND gate 82P. NAND gates 82N, 82P are cross-coupled with one another (i.e., the output of each is connected to an input of the other), effectively creating an R-S latch. The output of NAND gate 82N drives control signal N_EN, and the output of NAND gate 82P drives control signal P_EN.

In operation, comparators 26P, 26N drive their respective outputs P_COMP, N_COMP high during each PWM cycle, as the respective levels P_IN, N_IN from amplifier 24 exceed the ramp voltage from ramp generator 25. If the level P_IN is higher than that of level N_IN, output P_COMP will make a low-to-high transition earlier, and a high-to-low transition later, than will output N_COMP; this situation corresponds to a positive differential input voltage at inputs IN+, IN–. In polarity logic 50 of FIG. 7b, the output of NAND gate 80N is driven low in response to the combination of line P_COMP at a high level and line N_COMP at a low level, which occurs in the positive polarity case of level P_IN being higher than level N_IN. Conversely, the output of NAND gate 80P is driven low in response to line N_COMP high in combination with line P_COMP low, which occurs in negative polarity cycles. As such, in positive polarity cycles in which the output of NAND gate 80N is low and NAND gate 80P is high, NAND gate 82P will drive a high logic level at its output on line P_EN and NAND gate 82N will drive a low logic level at its output on line N_EN; the cross-coupling of NAND gates 82P, 82N latch in which the output of NAND gate 80P is low and NAND gate 80N is high, NAND gate 82N will drive a high logic level at its output on line N_EN and NAND gate 82P will drive a low logic level onto line P_EN. These control signals P_EN, N_EN are applied to AND gates 54P, 54N in offset logic 30', as will be described below.

Figure 8:
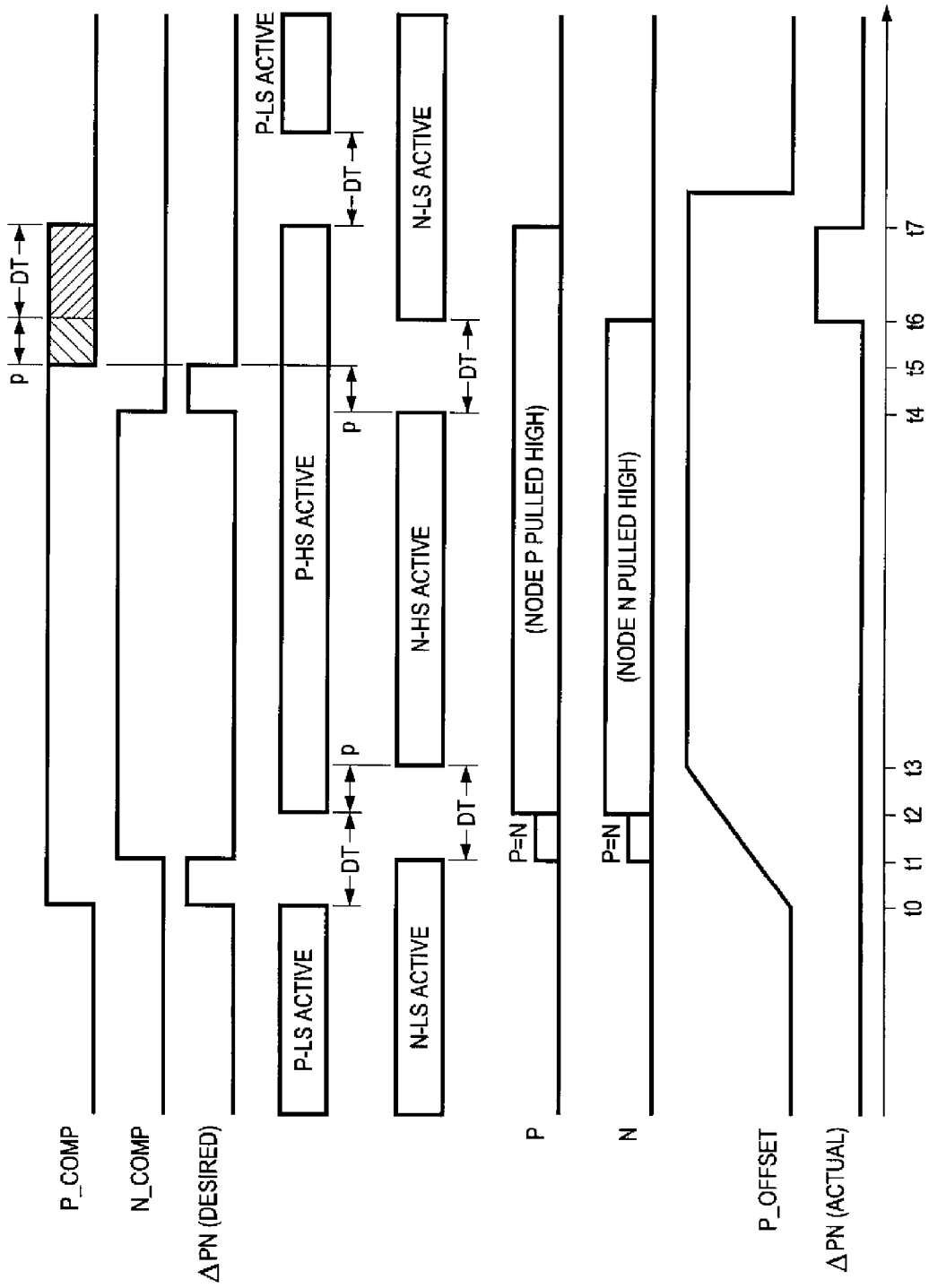
FIG. 8 is a timing diagram illustrating the operation of the circuit of FIG. 7a according to that embodiment of the invention.
Figure 9:
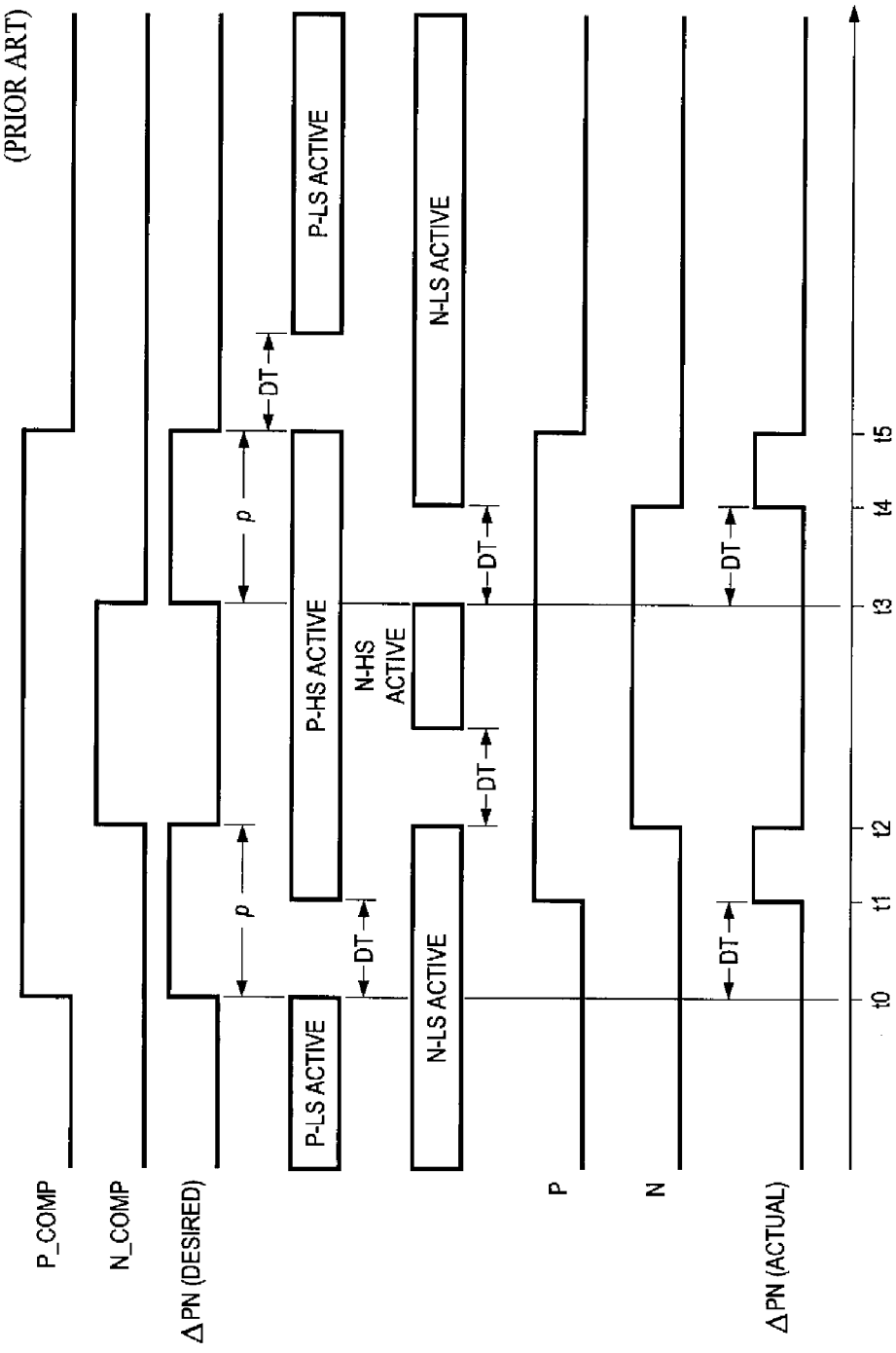
FIG. 9 is a timing diagram illustrating the operation of the conventional circuit of FIG. 1 in response to larger input signal levels.

The operation of offset logic 30' of FIG. 7a in providing a correction to comparator 26P, during a positive output voltage cycle, will now be described in connection with FIG. 8. It will of course be understood that application of this correction to comparator 26N during negative output voltage cycles will be carried out in a similar manner. As in the previous examples, output P_COMP from comparator 26P makes a low-to-high transition at time t0, in response to the instantaneous voltage of the triangle reference signal falling below the voltage at input P_IN from integrating differential amplifier 24, at time t0. And, as before, P-side drive circuit 29P begins the P-side dead-time at time t0, in response to the transition at comparator 26P output P_COMP. In this embodiment of the invention, however, this P-side dead-time is sensed by XNOR gate 51P, which drives its output to an active high level that is passed by OR gate 53. During the first half of the PWM period, clock signal CLK is at a high level; also in this cycle, polarity logic circuitry 50 issues a high level on control signal P_EN, as described above. Because all inputs to AND gate 54P are at a high logic level at this time, a high logic level is driven at the output of AND gate 54P, turning on pass gate 35P and thus charging capacitor 38P. The voltage P_offset thus begins charging, in this example, from the initiation of the P-side dead-time at time t0.

At time t1, comparator 26N output N_COMP makes a low-to-high transition, initiating the N-side dead-time, which results in a high level at the output of XNOR gate 51N. This high output maintains a high level at the output of OR gate 53 after the P-side dead-time ends at time t2. Because clock signal CLK and control signal P_EN also remain high during this time, AND gate 54P continues to turn on pass gate 35P and thus continues the charging of capacitor 38P. At time t3, which is the end of the N-side dead-time, XNOR gate 51N returns its output low; this state propagates through OR gate 53 and AND gate 54P, and turns off pass gate 35P.

In the second half of this PWM cycle, output N_COMP from comparator 26P returns to an active low level at time t4, initiating the N-side dead-time. Time t5 is the time at which output P_COMP would return low, but for the offset voltage across capacitor 38P, which is applied to comparator 26P as shown in FIG. 12 via lines P_offset. Because of this offset, output P_COMP from comparator 26P does not make a high-to-low transition until after a time period corresponding to the logical intersection of the P-side and N-side dead times, which amounts to an estimate p of the disturbance (P-side high-side drive active during N-side dead-time) plus an estimate DT of the P-side dead-time. At time t7, output P_comp returns to its low level after this extended time. By this time t7, however, the N-side dead-time has expired (at time t6). As a result, from time t6 until this time t7, P-side drive circuit 29P will have been driving node P to a high level while N-side drive circuit 29N is driving node N to a low level. A differential voltage is thus applied across load 21, for the duration between time t6 and time t7. This duration approximates the desired differential voltage ΔPN (the sum of both pulses) that would have been applied in the absence of any dead-time by the drive circuit.

For negative-polarity amplitude signal levels, offset logic 30' operates in a complementary fashion to similarly apply an offset on lines N_offset to comparator 26N, lengthening the pulse at output NCOMP by a time corresponding to a disturbance p plus a dead-time DT.

As described above relative to FIG. 5, offset logic 30' operates on the assumption that the pulses output by comparators 26P, 26N are symmetric in time. In other words, the operation of offset logic 30' uses an estimate of the disturbance duration p and dead-time DT from the first half-cycle (i.e., rising edges of outputs P_COMP, N_COMP) as the valid estimate for both transitions of the comparator outputs.

Offset logic 30' according to this embodiment of the invention therefore provides correction for harmonic distortion in the output energy applied to the load, for example a loudspeaker, for small amplitude signal levels resulting from the dead-time involved in the filterless class D amplifier arrangement. Accordingly, the output fidelity for low signal amplitude passages or events is greatly improved. Furthermore, this correction is attained without reducing the dead-time DT, and thus without additional risk of crowbar current at the drive stages, and also without necessarily increasing the complexity of integrating differential amplifier 24 (as would be required in order to safely decrease the dead-time). It is contemplated that the embodiment of the invention will typically be more accurate in correcting the dead-time error in amplifier 20, as compared with offset logic 30 described above relative to FIG. 5. However, additional logic complexity is required in this embodiment of the invention, in order to charge capacitors 38P, 38N from both events. It is contemplated that those skilled in the art can readily resolve that particular tradeoff in implementing offset logic 30 or offset logic 30', according to these embodiments of the invention. Also according to this invention, offset logic 30, 30' is not only capable of correcting for possible distortion at low signal amplitudes, as described above, but can also compensate for dead-time distortion that is present at larger signal amplitudes.

The embodiments of this invention described above in connection with offset logic 30, 30' assume symmetry in the signal pulses about the midpoint of the PWM cycle (i.e., symmetric about the time at which the triangle reference waveform changes direction). This symmetry is not necessarily present, especially at higher signal frequencies. According to another embodiment of the invention, as will be described in connection with FIGS. 10 and 11, compensation and correction for dead-time and its effects contemplates the possibility of asymmetry in this signal.

Figure 10:
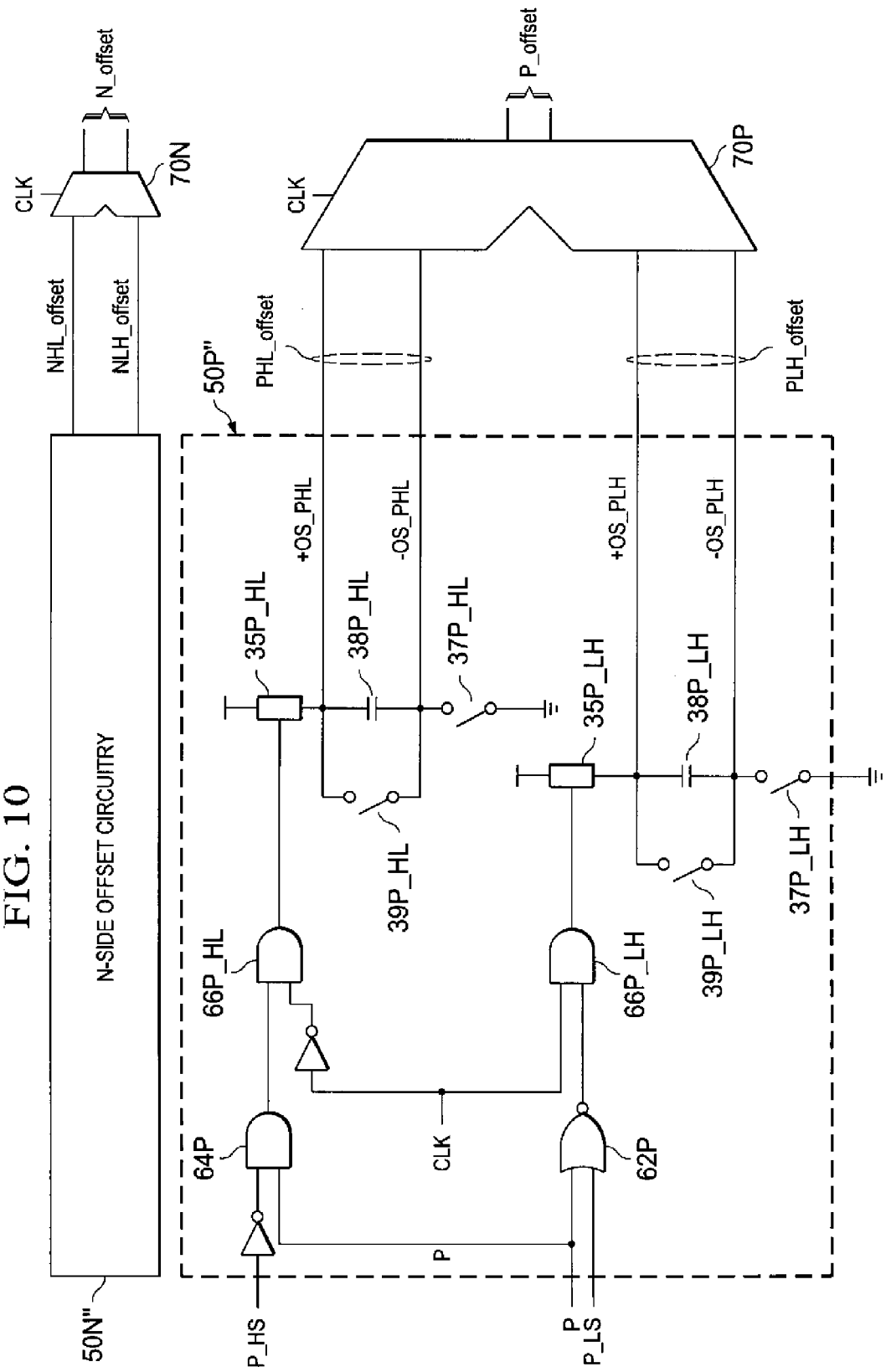
FIG. 10 is an electrical diagram, in schematic form, illustrating the construction of offset logic in the circuit of FIG. 4 according to another embodiment of the invention.

FIG. 10 illustrates the construction of offset logic 30" according to this alternative embodiment of the invention. Offset logic 30" includes circuitry 50P" for providing an offset signal based on the operation of the P side of the H-bridge, and also circuitry 50N" for providing an offset derived from the N side of the H-bridge. However, both P-side offset circuitry 50P" and N-side offset circuitry 50N" provide offsets for differential input signal amplitudes of both positive and negative amplitude, as will be evident from the following description. According to this embodiment of the invention, offset logic 50P" and 50N" are similarly constructed relative to one another, differing only in the side of the drive circuitry from which the input signals are obtained and, of course, in the destination of their generated offset signals, which are applied to comparators 26P, 26N, respectively.

In this embodiment of the invention, offset logic 30" includes two capacitors for each of the P and N sides. More specifically, one of the pair of capacitors stores a voltage based on an estimate of the actual driver dead-time for low-to-high transitions of the corresponding comparator output, while the other of the pair of capacitors separately stores a voltage based on an estimate of the actual driver dead-time for high-to-low comparator output transitions. As a result, offset logic 30" does not assume symmetry in the pulse-width-modulated output signal, but instead provides the capability of correcting errors from each of the two transitions of the comparator output in each PWM cycle. Furthermore, offset logic 30" bases each of its offset corrections on the actual behavior at load 21, and therefore is not vulnerable to the inaccuracy of assumptions of the effects of load 21 on the voltages at nodes P, N.

The construction of offset logic 50" according to this embodiment of the invention will now be described in connection with P-side offset circuitry 50P", it being understood that N-side offset circuitry 50N" will be similarly constructed. As shown in FIG. 10, the low-to-high-transition side of P-side offset logic 50P" includes NOR gate 62P, which receives signal P_LS from the output of P-side drive circuit 29P and the level of node P at load 21 at its other input. The output of NOR gate 62P is connected to an input of AND gate 66P_LH. A second input of AND gate 66P_LH receives the master (PWM) clock CLK at its other input. The output of AND gate 66P_LH is connected to the gate of pass gate 35P_LH, to control the charging of capacitor 38P_LH in similar manner as described above. Reset transistor 39P_LH is connected in parallel with capacitor 38P_LH, and one plate of capacitor 38 P_LH is switchably connectable to ground via switch 37P_LH. Capacitor 38P_LH presents its voltage on lines +OS_PLH, –OS_PLH to an input pair of multiplexer 70P, which has its output coupled to comparator 26P in the manner described above relative to FIG. 12.

P-side offset logic 50P" also includes circuitry that responds to high-to-low transitions of the output of comparator 26P. On this side, AND gate 64P has inputs receiving the signal P_HS (after inversion) from P-side drive circuit 29, and the level of node P. The output of AND gate 64P is connected to an input of AND gate 66P_HL, which receives an inverted version of the master clock signal CLK at its other input. The output of AND gate 66P_HL is applied to the gate of pass gate 35P_HL, which controls the charging of capacitor 38P_HL, across which voltage PHL_offset is defined. Switches 39P_HL, 37P_HL are provided in connection with capacitor 38P_HL, in the same manner as described above.

As mentioned above, N-side offset logic 50N" is similarly constructed as P-side offset logic 50P", for generating an offset level N_offset that is applied to comparator 26N, correcting for dead-time effects at the N-side drive.

As evident from FIG. 10, multiplexers 70P, 70N are provided to select which offset voltage (e.g., PLH_offset, PHL_offset) to apply within the PWM cycle; as such, each of multiplexers 70P, 70N receive clock signal CLK at their respective select inputs. In general, as will become evident from the following description, an offset defined from each low-to-high transition half cycle will be applied during the next high-to-low transition half cycle, and vice versa. Through the operation of multiplexers 70P, 70N, the construction and operation of comparators 26P, 26N, respectively, corresponds to that described above relative to FIG. 12. It is of course contemplated that other approaches to applying the offset voltages from offset logic 30" to comparators 26P, 26N can alternatively be used, such other approaches including the construction of comparators 26P, 26N to include additional stages, and the like.

The operation of offset logic 30" will now be described in connection with the example of a positive polarity differential input signal at inputs IN+, IN–. In this example, N-side large signal offset logic 50N" will not be responsive, and will add no offset to the differential signal being processed. As such, this operation will be described, by way of this example, with reference to P-side offset logic 50P" as shown in FIG. 10, in combination with the timing diagram of FIG. 11.

At time t0, master PWM clock CLK makes a low-to-high transition, which as described above, coincides with or initiates a downward ramp of the triangle reference waveform (not shown) applied to comparators 26P, 26N. In addition, according to this embodiment of the invention, reset transistor 39P_LH (and also a corresponding reset transistor for the low-to-high transition in N-side large signal offset logic circuit 50N") is turned on briefly to discharge any residual charge at capacitor 38P_LH. As will be apparent from this description, high-to-low transition reset transistor 39P_HL is not turned on at this half-cycle. As before, the differential input signal voltage at inputs IN+, IN− is integrated and amplified before application to comparators 26P, 26N. Because the differential voltage is of positive polarity in this example, output PCOMP from comparator 26P makes a low-to-high transition (at time t1), well before that transition at output NCOMP from comparator 26N (time t4).

Drive circuit 29P enforces a dead-time beginning at time t1, upon input PCOMP making its low-to-high transition. As discussed above, this causes drive circuit 29P to drive both of its outputs P_HS and P_LS to a low level, placing node P into a high impedance state. Accordingly, at the beginning of this dead-time, line P_LS is driven low, and line P remains low. The output of NOR gate 62P is then at a high level, as is master clock signal CLK during this half-cycle. The output of AND gate 66P_LH is thus driven high, which turns on pass gate 35P_LH and begins the charging of capacitor 38P_LH. As evident from FIG. 11, this condition remains even after the end of the dead time at time t2 (when drive circuit 29P drives a high level at line P_HS). Theoretically, for an ideal load 21, node P would also be driven high at time t2, upon line P_HS going high (and line N_LS remaining active). However, the effects of load 21 often cause a delay in node P reaching its high level; according to this embodiment of the invention, offset logic 50" is intended to measure and correct for such load-driven error. Accordingly, upon node P being driven high, at time t3 in FIG. 11, NOR gate 62P drives its output low, which propagates through AND gate 66P_LH to turn off pass gate 35P_LH. The time during which capacitor 38P_LH is charged, during this low-to-high transition half cycle, is shown by time $DTP_{LH}$ in FIG. 11, and corresponds to a "dead time" beginning with the P-side drive being turned off, and ending with node P at load 21 actually being pulled high by P-side drive circuit 29P. This time information is stored as charge at capacitor 38P_LH, and that charge will be applied to comparator 26P (FIG. 12) in the next half-cycle. Meanwhile, beginning at time t3 after dead time $DTP_{LH}$, a differential voltage ΔPN appears across load 21.

At time t4, the output of comparator 26N goes high, as the triangle reference waveform drops below the voltage at input N+ to comparator 26N. N-side offset logic 50N" includes the equivalent circuitry to NOR gate 62P and AND gate 66P_LH, which measures the time duration between the commencement of the N-side dead-time at time t4, and the time at which node N is pulled high from the P-side drive through load 21, which is at time t5 in the example of FIG. 11. During that time $DTN_{LH}$, a capacitor within N-side offset circuitry 50N" is charged from the $V_{dd}$ power supply, similarly as capacitor 38P_LH (FIG. 10). The charge on this capacitor will be applied to comparator 26N during the next half-cycle. High-side drive N_HS goes active after dead-time DT, at which point nodes P, N are both driven high.

Master PWM clock CLK makes a high-to-low transition at approximately mid-cycle (time $t_m$). This indicates (or initiates) a positive-going ramp of the triangle reference signal applied to comparators 26P, 26N. In addition, this event forces the output of AND gate 66P_LH to a low level, effectively isolating capacitor 38P_LH from being charged during this half-cycle. Conversely, AND gate 66P_HL is now enabled to respond to transitions at the output of AND gate 64P. In addition, after this high-to-low transition of master PWM clock CLK, reset transistor 39P_HL turns on briefly, discharging any residual charge on capacitor 38P_HL.

At time t6, the triangle reference waveform exceeds the input N+ from integrating amplifier 24 into comparator 26N. However, due to the charge stored at capacitor 38N_LH in the previous half-cycle (corresponding to time $DTN_{LH}$) and that is applied to the inputs of comparator 26N, comparator 26N will delay its output transition. This delay expires at time t7, at which time comparator 26N drives its output NCOMP to a low level. A dead-time then begins at the N-side drive, during which node N remains high through the operation of load 21. At the end of the dead-time, which expires at time t8, the low-side drive signal N_LS is driven active and node N is pulled low as a result.

During the second half-cycle following the transition of master clock CLK at time $t_m$, the voltage at capacitor 38P_LH is applied to comparator 26P (FIG. 12) via lines PLH_offset and multiplexer 70P, adding a differential voltage offset corresponding to the sensed time $DTP_{LH}$ measured in the first half-cycle. As a result, the high-to-low transition on line PCOMP at the output of comparator 26P is delayed (from its original time t9 corresponding to the actual differential voltage form integrating amplifier 24) by a time duration corresponding to the voltage stored at capacitor 38P_LH in the first half-cycle. As described above, this voltage is effectively a measure of the time $DTP_{LH}$ between time t1 at which the output of drive circuit 29P enters its high-impedance state, and time t3 at which node P actually reaches its active high level. Accordingly, the time t9' at which line PCOMP makes its high-to-low transition is delayed from its nominal time t9 by a duration corresponding to time interval $DTP_{LH}$. Because the N-side low-side drive N_LS is already active at time t9', this extension of the transition time at output PCOMP of comparator 26P extends the differential voltage ΔPN applied across load 21. This extension compensates for the measured error time $DTP_{LH}$ caused by the dead-time of drive circuit 29P and the effects of load 21 in the first half-cycle, responsive to the low-to-high transition of comparator 26P. As such, the P-side error measured in the first half-cycle is compensated by extending the P-side drive time in the next half-cycle.

Beginning at time t9', with the high-to-low transition at output PCOMP, drive circuit 29P again initiates a dead-time. Because of the inversion of line P_HS applied to AND gate 64P and also the continuing high level at node P, this transition causes AND gate 66P_HL to drive its output to a high level, turning on pass gate 35P_HL, and charging capacitor 38P_HL from the $V_{dd}$ power supply. Capacitor 38P_HL continues being charged until node P is pulled low by the active low-side drive signal N_LS through load 21, which occurs at time t10 in this example. This charging of capacitor 38P_HL, during time $DTP_{HL}$ thus begins with the dead-time of P side drive circuit 29P, and ends at a time at which node P reaches a low level, which depends on the characteristics of load 21. This time $DTP_{HL}$ is not necessarily of the same duration as (i.e., is not necessarily symmetric with) time $DTP_{LH}$ in the first half-cycle. However, each of these two transition times are measured independently, eliminating the potential for error due to assuming symmetric operation.

Figure 11:
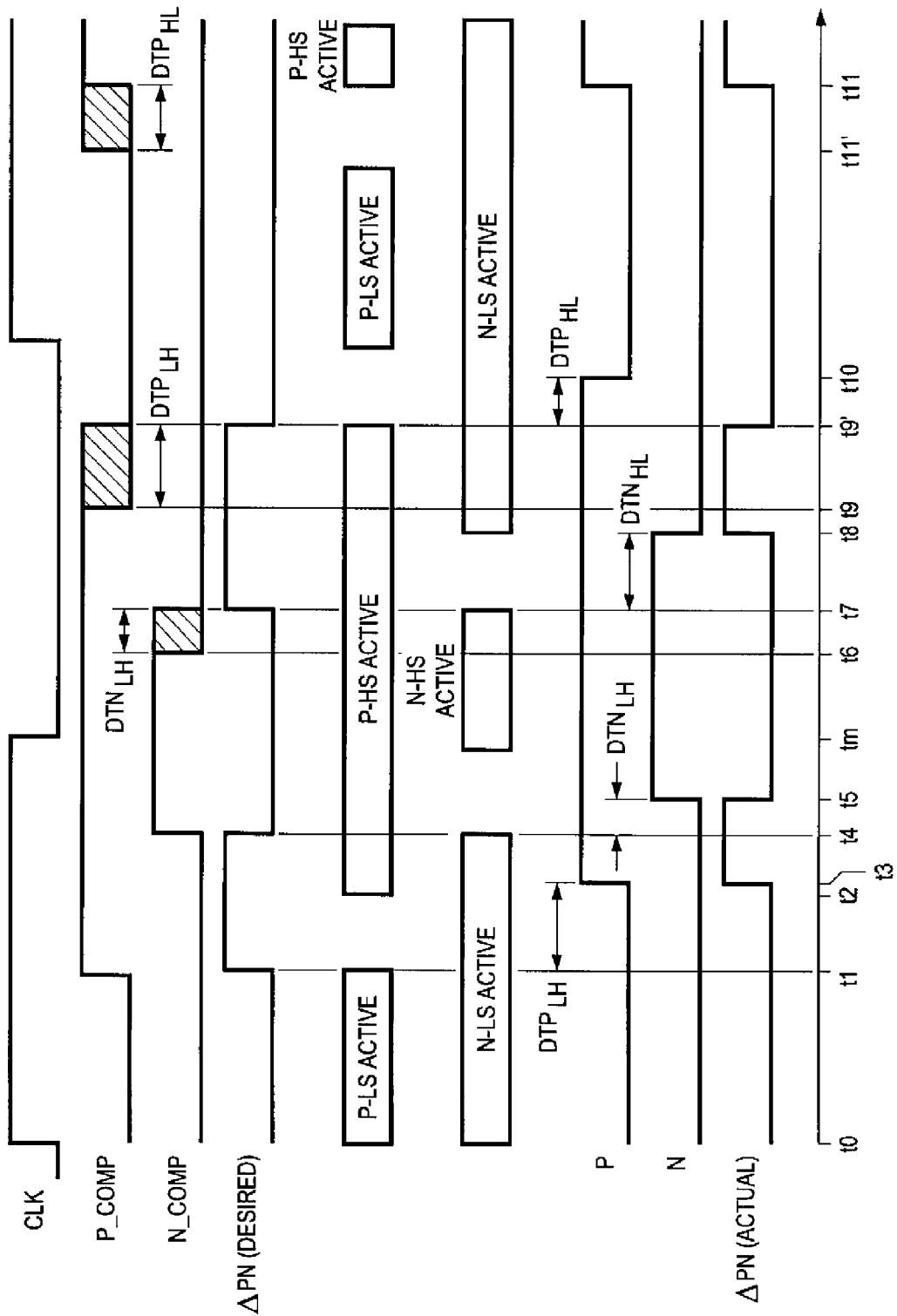
FIG. 11 is a timing diagram illustrating the operation of the circuit of FIG. 10 in the overall circuit of FIG. 4 according to that embodiment of the invention.

In similar manner as described above for the P-side high-to-low transition, N-side offset circuitry 50N" measures the time beginning from the start of the dead time at N-side drive circuit 29N (time t7) and the time at which node N is pulled low. That time duration is shown in FIG. 11 as interval $DTN_{HL}$. A capacitor within N-side offset circuitry 50" stores charge corresponding to that interval $DTN_{HL}$, in similar manner as capacitor 39P_HL of FIG. 10.

Following time t10, the next cycle of master PWM clock CLK begins with a low-to-high transition. Reset transistor 39P_LH discharges capacitor 38P_LH to remove any residual charge, prior to its charging upon the low-to-high transition at the output of comparator PCOMP. However, the voltage stored at capacitor 38P_HL is applied via lines PHL_offset and multiplexer 70P to comparator 26P, which increases the voltage on line P+ at the input of comparator 26P relative to the triangle reference waveform, advancing the time of the low-to-high transition of output PCOMP from comparator 26P. At time t11', this low-to-high transition at output PCOMP occurs, which is earlier than its nominal time t11 (based on the input differential voltage) by a time corresponding to the charge stored at capacitor 38P_HL. Because this charge is a measure of the time interval $DTP_{HL}$, the time by which the low-to-high transition at output PCOMP is advanced corresponds to that measured interval $DTP_{HL}$.

Similarly, the charge stored at the corresponding capacitor within N-side offset circuitry 50N" will be applied to comparator 26N in the next cycle, also advancing the time at which the output of comparator 26N makes its low-to-high transition.

According to this embodiment of the invention, therefore, offset logic 30" accurately corrects for error in the duration of output voltage ΔPN caused by dead-time of the drive circuitry, even if the comparator outputs are not symmetric within the PWM cycle, considering that separate dead-time offset voltages are generated for each transition. In addition, the effects of the output load on the time at which the drive nodes actually make their transition are also a factor in the correction offset that is generated and applied, further improving the fidelity of the correction according to this embodiment of the invention. It is contemplated that this approach by offset logic 30" is especially beneficial at larger input signal frequencies. In addition, it is contemplated that this asymmetric approach illustrated in FIGS. 10 and 11 may be applied in combination with either of the approaches of offset logic 30, 30', and that some of the logic circuitry may be shared among these various implementations.

According to these embodiments of the invention, therefore, improved fidelity in the output energy applied to a load, such as an audio loudspeaker, is attained without compromise of the dead-time intervals of the push-pull drive circuits, and thus without risk of undesirable and potentially damaging rail-to-rail crowbar current through the output drivers. Significant reduction in total harmonic distortion (THD) has been attained by implementations of these embodiments of the invention, both at small input signal amplitudes and also large input signal amplitudes. In addition, this improved fidelity is attained without requiring the bandwidth of the integrating amplifiers to be increased, for example by implementing higher-order feedback and additional components or complexity. Accordingly, it is contemplated that these embodiments of the invention can be readily implemented in relatively low-cost circuitry, thus improving the fidelity of low-cost and battery-powered audio and other systems.

While the present invention has been described according to its preferred embodiments, it is of course contemplated that modifications of, and alternatives to, these embodiments, such modifications and alternatives obtaining the advantages and benefits of this invention, will be apparent to those of ordinary skill in the art having reference to this specification and its drawings. It is contemplated that such modifications and alternatives are within the scope of this invention as subsequently claimed herein.

What is claimed is:

1. A class D output amplifier circuit, comprising:
   a first push-pull output stage, comprising a first pull-up transistor and a first pull-down transistor having conduction paths connected in series between first and second reference voltages and defining a first output node at a connection between the conduction paths, each of the first pull-up and pull-down transistors having control terminals;
   a second push-pull output stage, comprising a second pull-up transistor and a second pull-down transistor having conduction paths connected in series between the first and second reference voltages and defining a second output node at a connection between the conduction paths, each of the second pull-up and pull-down transistors having control terminals;
   a first drive circuit, having outputs coupled to the control terminals of the first pull-up and pull-down transistors, and having an input, the first drive circuit for controlling driving its outputs in response to a logic signal at its input in such a manner that, responsive to a transition at its input, the first drive circuit issues signals at its outputs so that both of the first pull-up and pull-down transistors are off for a selected dead-time;
   a second drive circuit, having outputs coupled to the control terminals of the second pull-up and pull-down transistors, and having an input, the second drive circuit for controlling driving its outputs in response to a logic signal at its input in such a manner that, responsive to a transition at its input, the second drive circuit issues signals at its outputs so that both of the second pull-up and pull-down transistors are off for a selected dead-time;
   a first comparator having a first input for receiving a first differential signal line, having a second input for receiving a reference waveform, having a third input for receiving an offset differential voltage, and having an output coupled to the input of the first drive circuit;
   a second comparator having a first input for receiving a second differential signal line, having a second input for receiving the reference waveform, having a third input for receiving an offset signal, and having an output coupled to the input of the second drive circuit; and
   offset logic circuitry, having inputs coupled to the first and second drive circuits, and having an outputs for driving an offset signal to the third input of one of the first and second comparators, the offset signal corresponding to a measured time duration in the operation of a corresponding one of the first or second drive circuits.

2. The circuit of claim 1, wherein the offset logic circuitry comprises:
   a first logic circuit for sensing the dead-time at the output of the second drive circuit in combination with a first selected logic level being driven from the first drive circuit;
   a first capacitor circuit, coupled to the output of the first logic circuit, for charging to a voltage corresponding to the time sensed by the first logic circuit;
   a second logic circuit for sensing the dead-time at the output of the first drive circuit in combination with a first selected logic level being driven from the second logic circuit; and
   a second capacitor circuit, coupled to the output of the second logic circuit, for charging to a voltage corresponding to the time sensed by the second logic circuit;
   wherein the offset signal corresponds to voltage stored at one or both of the first and second capacitor circuits.

3. The circuit of claim 2, wherein the reference waveform corresponds to a periodic time-varying voltage at a pulse-width-modulation frequency;

wherein the offset logic circuitry further comprises:

gating circuitry, for enabling the first and second logic circuits during a first half-cycle of the reference waveform and for blocking operation of the first and second logic circuits during a second half-cycle of the reference waveform.

4. The circuit of claim 1, wherein the offset logic circuitry comprises:

a first dead-time logic function for sensing the dead-time at the output of the first drive circuit;

a second dead-time logic function for sensing the dead-time at the output of the second drive circuit;

circuitry for charging the first capacitor circuit to a voltage corresponding to a sum of the sensed dead-time at the first drive circuit plus the dead-time at the output of the second drive circuit in combination with the first selected logic level being driven from the first drive circuit, responsive to a positive polarity differential signal at the first and second differential signal lines; and circuitry for charging the second capacitor circuit to a voltage corresponding to a sum of the sensed dead-time at the second drive circuit plus the dead-time at the output of the first drive circuit in combination with the first selected logic level being driven from the second drive circuit, responsive to a negative polarity differential signal at the first and second differential signal lines.

5. The circuit of claim 1, wherein each of the first and second comparators comprises:

a first differential stage receiving a differential signal corresponding to the input differential signal, and having first and second outputs;

a second differential stage, having inputs coupled to the third input to receive the offset signal in the form of a differential signal, and having first and second outputs coupled to the first and second outputs of the first differential stage;

and a differential output stage for generating an output signal corresponding to the outputs of the first and second differential stages.

6. The circuit of claim 1, wherein the offset logic circuitry comprises:

a first offset logic function, having inputs coupled to the first and second drive circuits, and having an output coupled to the third input of the first comparator, comprising:

a first low-to-high transition function, for sensing a time duration between initiation of the dead-time at the output of the first drive circuit and a time at which the first output node is driven high, during a first half-cycle of the reference waveform;

a first low-to-high capacitor function, for charging to a voltage corresponding to the time duration sensed by the first low-to-high transition function;

a first high-to-low transition function, for sensing a time duration between initiation of the dead-time at the output of the first drive circuit and a time at which the first output node is driven low, during a second half-cycle of the reference waveform; and a first high-to-low capacitor function, for charging to a voltage corresponding to the time duration sensed by the first high-to-low transition function; and a second offset logic function, having inputs coupled to the first and second drive circuits, and having an output coupled to the third input of the second comparator, comprising:

a second low-to-high transition function, for sensing a time duration between initiation of the dead-time at the output of the second drive circuit and a time at which the second output node is driven high, during a first half-cycle of the reference waveform;

a second low-to-high capacitor function, for charging to a voltage corresponding to the dead-time sensed by the second low-to-high transition function;

a second high-to-low transition function, for sensing a time duration between initiation of the dead-time at the output of the second drive circuit and a time at which the second output node is driven low, during a second half-cycle of the reference waveform; and a second high-to-low capacitor function, for charging to a voltage corresponding to the dead-time sensed by the second high-to-low transition function.

7. The circuit of claim 6, wherein the voltage stored by the first and second low-to-high capacitor functions is applied to the first and second comparators, respectively, during the second half-cycle, and wherein the voltage stored by the first and second high-to-low capacitor functions is applied to the first and second comparators, respectively, during the first half-cycle.

8. The circuit of claim 1, further comprising:

an integrating differential amplifier, receiving an input differential signal and for generating an amplified differential signal at the first and second differential signal lines in response to the input differential signal.

9. The circuit of claim 8, wherein the integrating differential amplifier comprises:

a differential amplifier stage; and a first order feedback network.

10. A method of operating a class D output drive circuit, comprising:

receiving an input differential signal;

generating a differential signal corresponding to the input differential signal at first and second differential signal lines;

comparing the voltage at the first differential signal line with a reference waveform to produce a first comparator output signal;

comparing the voltage at the second differential signal line with the reference waveform to produce a second comparator output signal;

controlling a first push-pull output stage to drive a first output node, coupled to one side of a load, responsive to the first comparator output signal, the controlling comprising enforcing a high impedance state at the first output node for a selected dead-time responsive to transitions of the first comparator output signal;

controlling a second push-pull output stage to drive a second output node, coupled to another side of the load, responsive to the second comparator output signal, comprising enforcing a high impedance state at the second output node for a selected dead-time responsive to transitions of the second comparator output signal;

wherein a differential voltage appears between the first and second output nodes for a duration corresponding to the input differential signal;

and further comprising:
adjusting the duration of the differential voltage between the first and second output nodes responsive to a duration of a high-impedance condition at one of the first and second output nodes.

11. The method of claim 10, wherein the adjusting step comprises:
charging a first capacitor for a time corresponding to a duration of a high-impedance state applied by the second push-pull output stage in combination with the first push-pull output stage driving the first output node to a first state; and
then applying voltage from the first capacitor as an offset to the first differential signal line for the comparing step.

12. The method of claim 11, wherein the steps of charging the first capacitor and applying voltage from the first capacitor are performed responsive to an input differential signal of a first polarity;
and further comprising, responsive to an input differential signal of a second polarity:
charging a second capacitor for a time corresponding to a duration of a high-impedance state applied by the first push-pull output stage in combination with the second push-pull output stage driving the second output node to the first state; and
then applying voltage from the second capacitor as an offset to the second differential signal line for the comparing step.

13. The method of claim 11, wherein the step of charging the first capacitor comprises:
charging the first capacitor for a time corresponding to the sum of a duration of a high-impedance state applied by the second push-pull output stage in combination with the first push-pull output stage driving the first output node to the first state, plus a duration of a high-impedance state applied by the first push-pull output stage;
and wherein the step of charging the second capacitor comprises:
charging the second capacitor for a time corresponding to the sum of a duration of a high-impedance state applied by the first push-pull output stage in combination with the second push-pull output stage driving the second output node to the first state, plus a duration of a high-impedance state applied by the second push-pull output stage.

14. The method of claim 10, wherein the reference waveform corresponds to a periodic time-varying voltage at a pulse-width-modulation frequency;
wherein the adjusting step comprises:
during a first half-cycle of the reference waveform, charging a first low-to-high capacitor for a duration beginning with a high-impedance state applied by the first push-pull output stage and ending with the first output node making a transition to a high level;
during the first half-cycle of the reference waveform, charging a second low-to-high capacitor for a duration beginning with a high-impedance state applied by the second push-pull output stage and ending with the second output node making a transition to the high level;
during a second half-cycle of the reference waveform, charging a first high-to-low capacitor for a duration beginning with a high-impedance state applied by the first push-pull output stage and ending with the first output node making a transition to a low level;
during the second half-cycle of the reference waveform, charging a second high-to-low capacitor for a duration beginning with a high-impedance state applied by the second push-pull output stage and ending with the second output node making a transition to the low level;
during the second half-cycle of the reference waveform, applying voltage from the first low-to-high capacitor to the first differential signal line and applying voltage from the second low-to-high capacitor to the second differential signal line; and
during a next first half-cycle of the reference waveform, applying voltage from the first high-to-low capacitor to the first differential signal line and applying voltage from the second high-to-low capacitor as an offset to the second differential signal line for the comparing step.

* * * * *